(12) United States Patent
Blomiley et al.

(10) Patent No.: US 7,585,371 B2
(45) Date of Patent: Sep. 8, 2009

(54) SUBSTRATE SUSCEPTORS FOR RECEIVING SEMICONDUCTOR SUBSTRATES TO BE DEPOSITED UPON

(75) Inventors: Eric R. Blomiley, Boise, ID (US); Nirmal Ramaswamy, Boise, ID (US); Ross S. Dando, Nampa, ID (US); Joel A. Drewes, Boise, ID (US); Danny Dynka, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 306 days.

(21) Appl. No.: 10/822,093

(22) Filed: Apr. 8, 2004

(65) Prior Publication Data

US 2005/0223994 A1 Oct. 13, 2005

(51) Int. Cl.
C23C 8/00 (2006.01)
C23C 16/00 (2006.01)

(52) U.S. Cl. .................... 118/725; 156/345.51; 118/728
(58) Field of Classification Search ................. 118/500, 118/725, 728; 156/345.51
See application file for complete search history.

(56) References Cited

U.S. PATENT DOCUMENTS

| | | | | |
|---|---|---|---|---|
| 5,536,918 | A | * | 7/1996 | Ohkase et al. ............... 219/390 |
| 5,569,350 | A | * | 10/1996 | Osada et al. ........... 156/345.51 |
| 5,965,047 | A | | 10/1999 | Blersch et al. |
| 6,022,809 | A | * | 2/2000 | Fan ............................ 438/710 |
| 6,054,183 | A | * | 4/2000 | Zimmer et al. ........... 427/249.8 |
| RE36,810 | E | * | 8/2000 | Arasawa et al. ........ 156/345.27 |
| 6,167,834 | B1 | * | 1/2001 | Wang et al. .............. 118/723 E |
| 6,277,194 | B1 | * | 8/2001 | Thilderkvist et al. .......... 117/94 |
| 6,455,814 | B1 | * | 9/2002 | Samoilov et al. ............ 219/390 |
| 6,468,354 | B2 | * | 10/2002 | Huang et al. ................. 118/730 |
| 6,825,051 | B2 | * | 11/2004 | AmRhein et al. ............... 438/9 |
| 2002/0011478 | A1 | * | 1/2002 | Ratliff et al. ................. 219/390 |
| 2003/0019428 | A1 | * | 1/2003 | Ku et al. ..................... 118/715 |
| 2003/0215963 | A1 | * | 11/2003 | AmRhein et al. ............... 438/9 |
| 2004/0163599 | A1 | * | 8/2004 | Hayashide et al. .......... 118/725 |
| 2004/0255868 | A1 | * | 12/2004 | AmRhein et al. ........... 118/728 |
| 2005/0016468 | A1 | * | 1/2005 | Ruhl et al. .................. 118/728 |
| 2005/0217569 | A1 | * | 10/2005 | Ramaswamy et al. ....... 117/105 |
| 2005/0223994 | A1 | * | 10/2005 | Blomiley et al. ............ 118/725 |
| 2006/0057826 | A1 | * | 3/2006 | De Boer ..................... 438/482 |
| 2006/0180084 | A1 | | 8/2006 | Blomiley et al. |

OTHER PUBLICATIONS

Raytek Brochure: Spectrum, pp. 1-16 (pre-Apr. 2004).

* cited by examiner

*Primary Examiner*—Sylvia R. MacArthur
(74) *Attorney, Agent, or Firm*—Wells St. John P.S.

(57) ABSTRACT

In one implementation, a substrate susceptor for receiving a semiconductor substrate for selective epitaxial silicon-comprising depositing thereon, where the depositing comprises measuring emissivity of the susceptor from at least one susceptor location in a non-contacting manner, includes a body having a front substrate receiving side, a back side, and a peripheral edge. At least one susceptor location from which emissivity is to be measured is received on at least one of the front substrate receiving side, the back side, and the edge. Such at least one susceptor location comprises an outermost surface comprising a material upon which selective epitaxial silicon will not deposit upon during selective epitaxial silicon depositing on a semiconductor substrate received by the susceptor for at least an initial thickness of epitaxial silicon depositing on said substrate. Other aspects and implementations are contemplated.

6 Claims, 13 Drawing Sheets

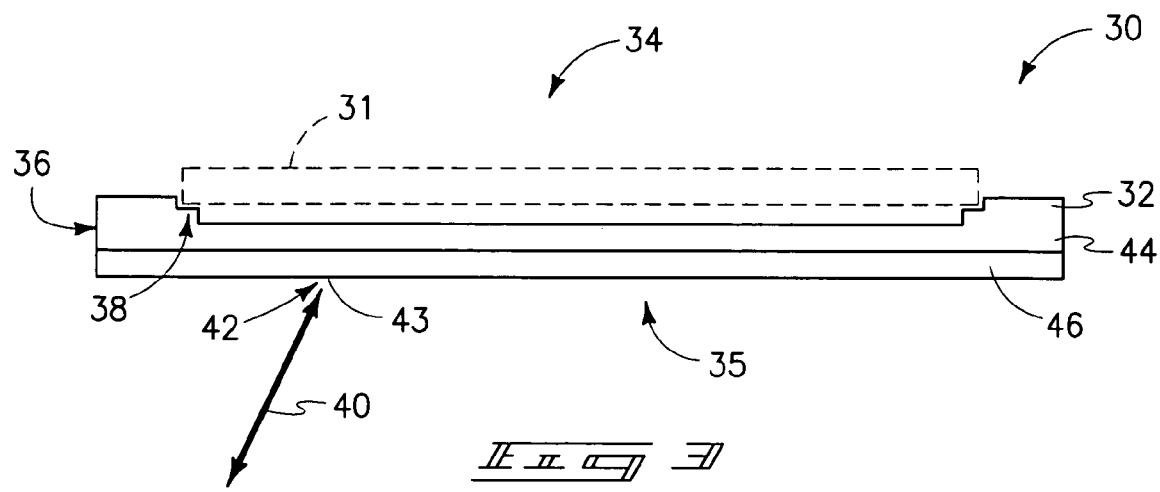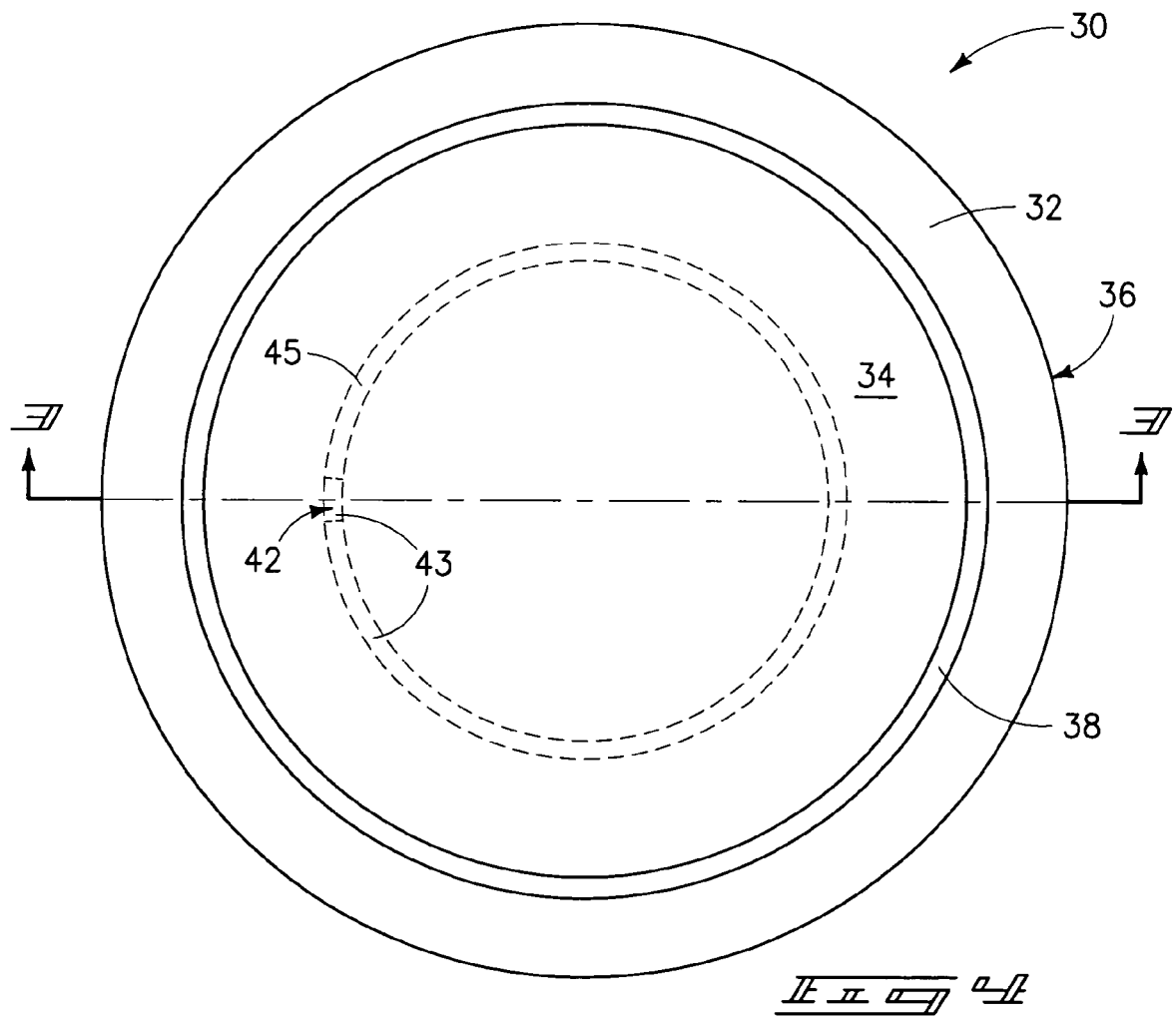

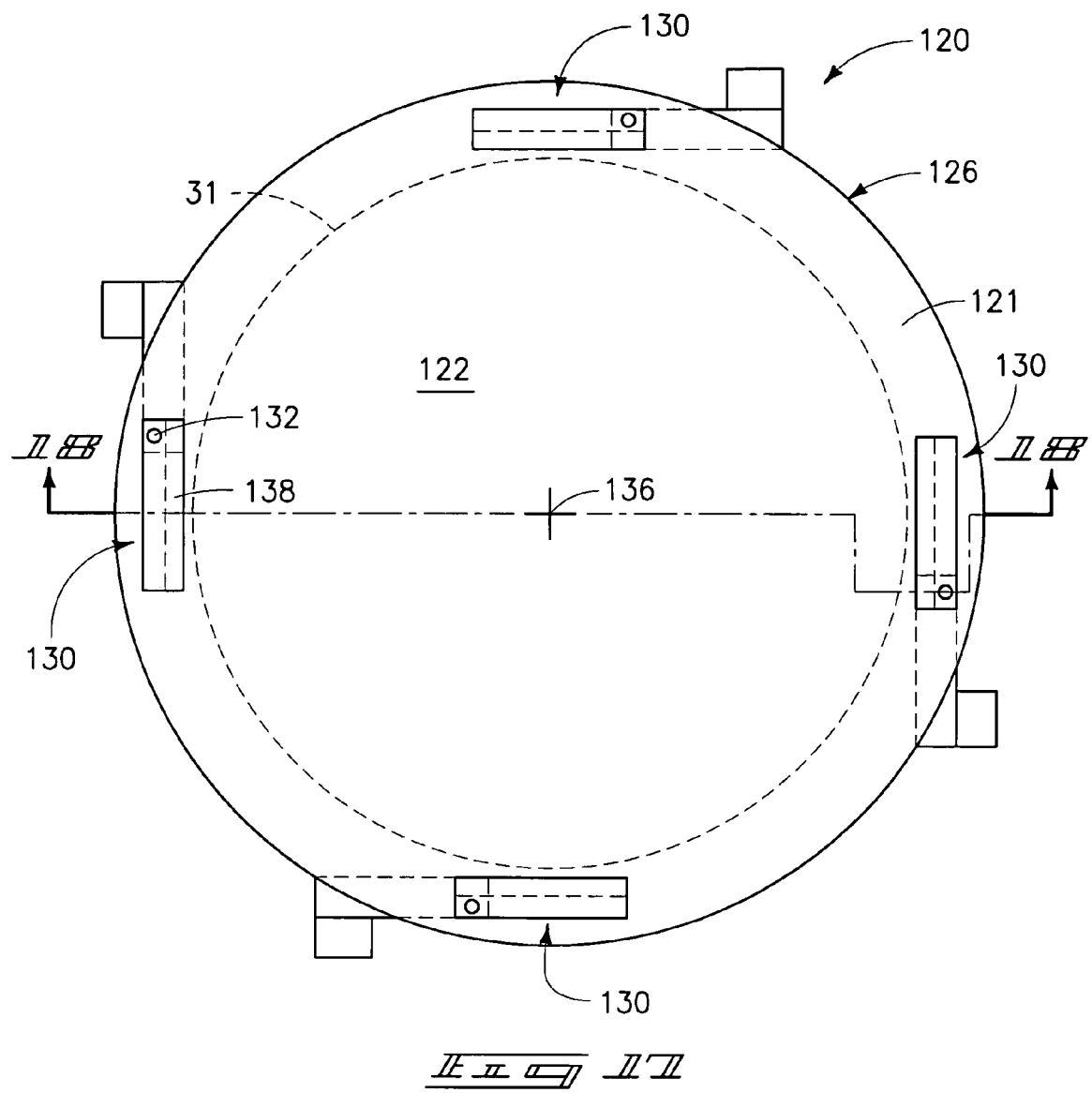
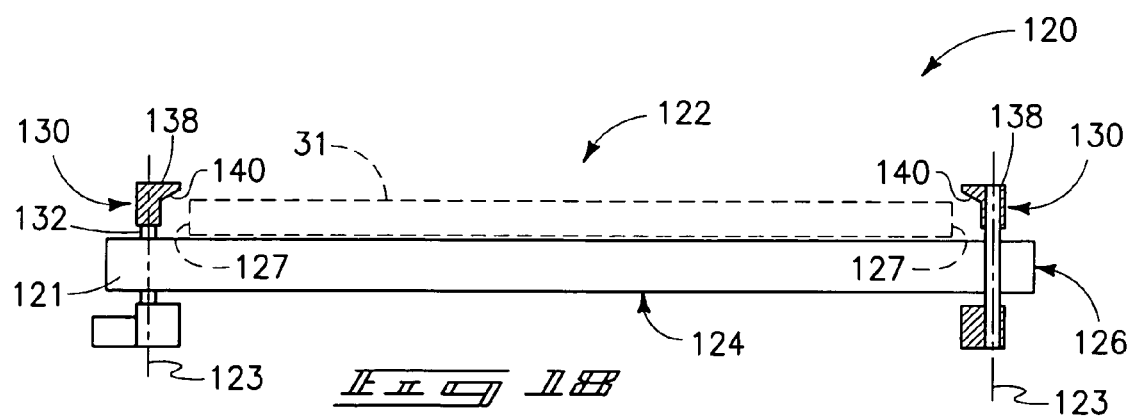

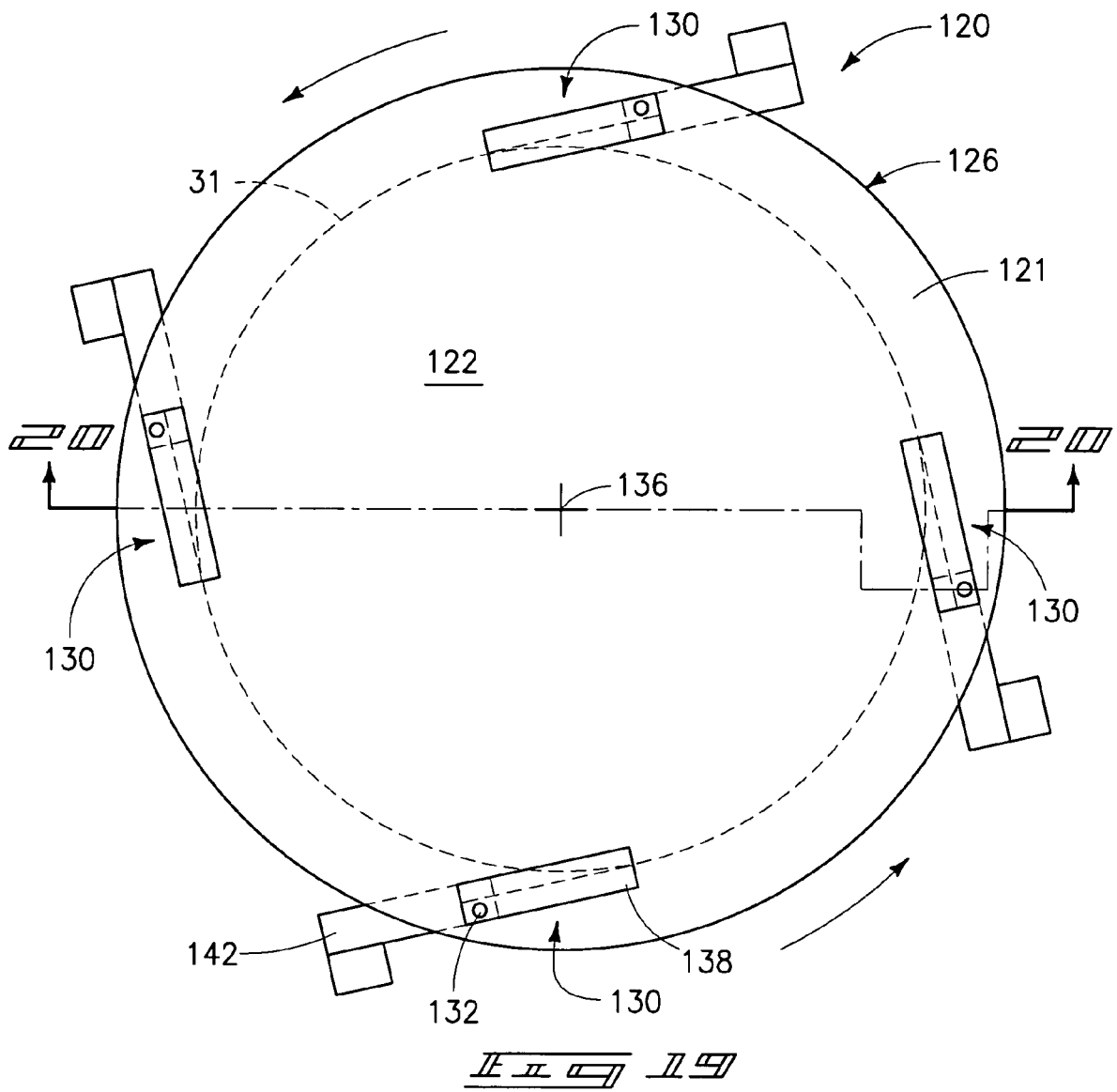
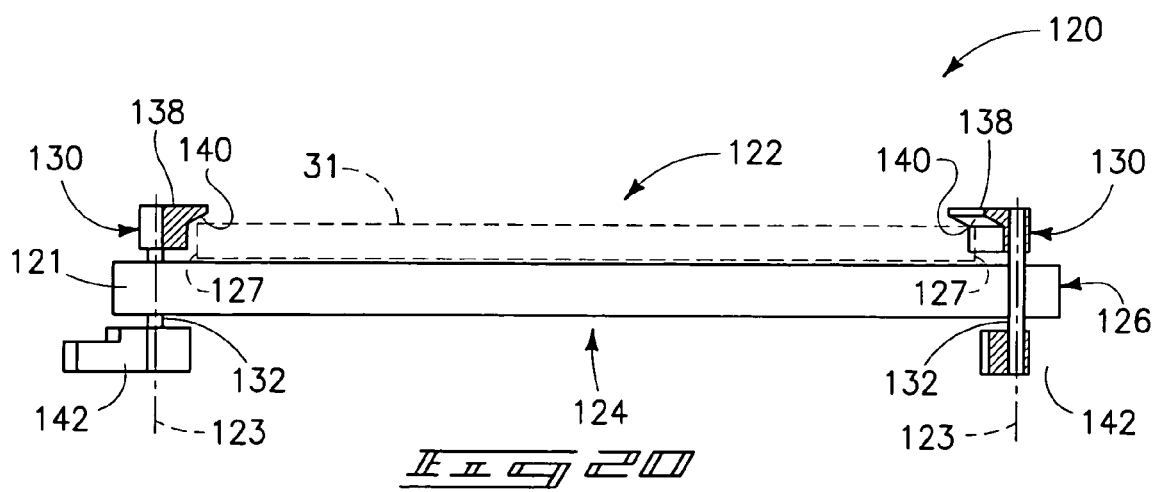

# SUBSTRATE SUSCEPTORS FOR RECEIVING SEMICONDUCTOR SUBSTRATES TO BE DEPOSITED UPON

TECHNICAL FIELD

This invention relates to substrate susceptors for receiving semiconductor substrates to be deposited upon and to methods of depositing materials over semiconductor substrates.

BACKGROUND OF THE INVENTION

Integrated circuitry fabrication includes deposition of material and layers over a substrate. One or more substrates are received within a deposition chamber within which deposition typically occurs. One or more precursors or substances are caused to flow to the substrate, typically as a vapor, to effect deposition of a layer over the substrate. A single substrate is typically positioned or supported for deposition by a susceptor. In the context of this document, a "susceptor" is any device which holds or supports at least one wafer within a chamber or environment for deposition. Deposition may occur by chemical vapor deposition, atomic layer deposition and/or by other means.

FIGS. 1 and 2 diagrammatically depict a prior art susceptor 10, and issues associated therewith which motivated some aspects of the invention. Susceptor 10 comprises a body 12 which receives a substrate 14 for deposition. Substrate 14 is received within a pocket or recess 16 of susceptor body 12 to elevationally and laterally retain substrate 14 in the desired position.

A particular exemplary system which motivated some of the inventive susceptor designs herein was a lamp heated, thermal deposition system having front and back side radiant heating of the substrate and susceptor for attaining desired temperature during deposition. FIG. 2 depicts a thermal deposition system having at least two radiant heating sources for each side of susceptor 10. Depicted are front side and back side peripheral radiation emitting sources 18 and 20, respectively, and front side and back side radially inner radiation emitting sources 22 and 24, respectively. Incident radiation from sources 18, 20, 22 and 24 typically overlap one another on the susceptor and substrate, creating overlap areas 25. Such can cause an annular region of the substrate corresponding in position to overlap areas 25 to be hotter than other areas of the substrate not so overlapped. Further, the center and periphery of the substrate can be cooler than even the substrate area which is not overlapped due to less than complete or even exposure to the incident radiation.

The susceptor is typically caused to rotate during deposition, with deposition precursor gas flows occurring along arrows "A" from one edge of the wafer, over the wafer and to the opposite side where such is exhausted from the chamber. Arrow "B" depicts a typical $H_2$ gas curtain within the chamber proximate a slit valve through which the substrate is moved into and out of the chamber. A preheat ring (not shown) is typically received about the susceptor, and provides another heat source which heats the gas flowing within the deposition chamber to the wafer along arrows A and B. However even so, the periphery of the substrate proximate where arrows A and B indicate gas flowing to the substrate is cooler than the central portion and the right-depicted portion of the substrate where the gas exits.

Additionally, robotic arms are typically used to position substrate 14 within recess 16. Such positioning of substrate 14 does not always result in the substrate being positioned entirely within susceptor recess 16. Further, gas flow might dislodge the wafer such that it is received both within and without recess 16. Such can further result in temperature variation across the substrate and, regardless, result in less controlled or uniform deposition over substrate 14.

The above-described system can be used for silicon deposition, including amorphous, monocrystalline and polycrystalline silicon, as well as deposition of silicon mixed with other materials such as a Si—Ge composition in any of crystalline and amorphous forms. Certain aspects of the invention were motivated relative to issues associated with selective epitaxial silicon deposition. In such deposition, a substrate to be deposited upon includes outwardly exposed elemental silicon containing surfaces as well as surfaces not containing silicon in elemental form. During a selective epitaxial silicon deposition, the silicon will preferentially/selectively grow typically only over the silicon surfaces and not the non-silicon surfaces. In many instances, near infinite selectivity is attained, at least for the typical thickness levels at which the selective epitaxial silicon is deposited or grown.

An exemplary prior art method for depositing selective epitaxial silicon includes flows of dichlorosilane at from 50 sccm to 500 sccm, HCl at from 50 sccm to 300 sccm and $H_2$ at from 3 slm to 40 slm. An exemplary preferred temperature range is from 750° C. to 1,050° C., with 850° C. being a specific example. An exemplary pressure range is from 5 Torr to 100 Torr, with 30 Torr being a specific example. Certain aspects of the invention also encompass selective epitaxial silicon-comprising deposition using the just-described prior art process (preferred), as well as other existing or yet-to-be developed methods.

An exemplary prior art susceptor comprises graphite completely coated with a thin layer (75 microns) of SiC. Such graphite typically has a thermal conductivity of from 180-200 W/mK, while that of SiC is about 250 W/mK. Unfortunately, a selective epitaxial silicon process such as described above will also deposit upon silicon carbide in addition to elemental form silicon. Accordingly, the susceptor also gets deposited upon during a selective epitaxial silicon deposition over regions of a substrate desired to be deposited upon received by the susceptor. This is undesirable at least for purposes of temperature control of the substrate during deposition.

For example, consider that the deposition chamber used in the above-described processing includes upper and lower transparent domes or chamber walls which in part define the internal chamber volume within which deposition occurs. Such domes are transparent to incident infrared radiation, with the lamps which heat the susceptor and substrate being received external of the chamber and domes, with light passing therethrough to provide desired temperature during the deposition. Further, temperature control typically includes the sensing of the temperature of the back side of the susceptor using optical pyrometry techniques. For example, such comprises a non-contacting temperature sensing whereby a sensor received externally of the lower dome is directed to the back side of the susceptor and measures emissivity therefrom and from which the temperature of the susceptor and substrate are derived. However with the back side-growing silicon being of a different material than that of the underlying susceptor, such affects the emission/absorption characteristics of the thermal energy. Such tends to affect the sensing of the susceptor temperature to be reported lower than it actually is. Therefore as a silicon coating builds upon the back side of the susceptor, more energy is typically added to the heat lamps which undesirably increases the substrate temperature in a manner which is difficult to control. In other words, where the optical properties of the susceptor back side change where temperature is being sensed or measured, the measured temperature also changes as well although the temperature of the susceptor might essentially be the same as before the back side coating.

With the above just-described configuration, drift in process control can occur after processing from only 1 to 4 wafers. The accumulated silicon on the susceptor back side has caused a temperature drift of from 1° C. to 2° C. In order to maintain repeatability from wafer to wafer, present methods of contending with the same include a between wafer chamber dry-clean to etch the susceptor, as well as re-depositing a small amount of silicon on the susceptor to provide an initial uniform surface. Such processing can take about as long as processing a single wafer alone, and accordingly reduces throughput by about 50 percent. Yet without re-establishing the chamber to a similar baseline condition, wafer repeatability in the selective silicon deposition is poor.

It would be desirable to develop improved susceptor designs and methods which address at least some of the above-identified problems. However although some aspects of the invention were motivated from this perspective and in conjunction with the above-described reactor and susceptor designs, the invention is in no way so limited. The invention is only limited by the accompanying claims as literally worded, without interpretive or other limiting reference to the specification and drawings, and in accordance with the doctrine of equivalents.

SUMMARY

This invention includes substrate susceptors for receiving semiconductor substrates to be deposited upon and methods of depositing materials over semiconductor substrates. In one implementation, a substrate susceptor for receiving a semiconductor substrate for selective epitaxial silicon-comprising depositing thereon, where the depositing comprises measuring emissivity of the susceptor from at least one susceptor location in a non-contacting manner, includes a body having a front substrate receiving side, a back side, and a peripheral edge. At least one susceptor location from which emissivity is to be measured is received on at least one of the front substrate receiving side, the back side, and the edge. Such at least one susceptor location comprises an outermost surface comprising a material upon which selective epitaxial silicon will not deposit upon during selective epitaxial silicon depositing on a semiconductor substrate received by the susceptor for at least an initial thickness of epitaxial silicon depositing on said substrate.

In one implementation, a substrate susceptor for receiving a semiconductor substrate to be deposited upon by thermal deposition comprising susceptor back side radiant heating includes a body having a front substrate receiving side, a back side, and a peripheral edge. The body comprises multiple materials having at least two different thermal conductivities. In one implementation, an outer material is received across the back side and has a higher thermal conductivity than an immediately adjacent material of the body, with such outer material comprising at least one of polycrystalline diamond and copper. In one implementation, the outer material is not received over an outer portion of any of the front substrate receiving side. In one implementation, an outer material is received across the back side and which has a thermal conductivity which is at least three times higher than that of an immediately adjacent material of the body. In one implementation, the multiple materials are received at different radial locations and not across an entirety of either the body front side or the body back side.

In one implementation, a substrate susceptor for receiving a semiconductor substrate to be deposited upon by thermal deposition comprising heating of the susceptor includes a body having a front substrate receiving side, a back side, and a peripheral edge. The body comprises a peripheral-most region comprising at least 10% of radius of the body and an inner region received radially inward of the peripheral-most region. The body comprises multiple materials having at least two different thermal conductivities. The peripheral-most region and the inner region have different average thermal conductivities.

In one implementation, a substrate susceptor for receiving a semiconductor substrate to be deposited upon comprises a body having a front substrate receiving side, a back side, and a peripheral edge. The body comprises at least one solid portion therethrough that is transparent to infrared radiation.

In one implementation, a method of depositing a material over a semiconductor substrate comprises positioning a semiconductor substrate on a susceptor. The susceptor has at least one solid portion therethrough that is transparent to infrared radiation and over which the semiconductor substrate is received. A material is deposited over the semiconductor substrate. In one implementation, during the depositing, substrate temperature is detected by measuring substrate emissivity from a back side of the semiconductor substrate through the at least one infrared radiation transparent portion of the susceptor from a back side of the susceptor using a non-contacting emissivity sensor. In one implementation, during the depositing, radiant energy is impinged onto the susceptor back side through the transparent solid portion effective to heat the semiconductor substrate being deposited upon.

In one implementation, a substrate susceptor for receiving a semiconductor substrate to be deposited upon comprises a body having a front substrate receiving side face, a back side face, and a peripheral edge. The body comprises a ring having a radial inner portion at least a radial majority of which is non-solid space extending from the front side face to the back side face.

In one implementation, a method of depositing an elemental silicon-comprising material over a semiconductor substrate comprises positioning a semiconductor substrate on a susceptor. The susceptor has a front substrate receiving side face and a back side face. The susceptor comprises a ring having a radial inner portion at least a radial majority of which is non-solid space extending from the front side face to-the back side face. The semiconductor substrate comprises a front side and a back side. An elemental silicon-comprising material is deposited at least on the substrate front side. During the depositing, radiant energy is impinged onto the substrate back side through the radial central non-solid portion of the susceptor.

In one implementation, a substrate susceptor for receiving a semiconductor substrate to be deposited upon comprises a body having a front substrate receiving side, a back side, and a peripheral edge. At least three movable substrate edge clamps are associated with the body, with the movable substrate edge clamps being positioned to engage a peripheral edge of a semiconductor substrate received by the body for deposition thereupon.

In one implementation, a method of depositing material over a semiconductor substrate comprises positioning a semiconductor substrate on a susceptor. A peripheral edge of the semiconductor substrate is engaged with at least three radially movable substrate edge clamps on the susceptor. The susceptor with semiconductor substrate is caused to rotate. A material is deposited over the semiconductor substrate while the semiconductor substrate is engaged with the substrate edge clamps.

In one implementation, a method of depositing material over a semiconductor substrate comprises positioning a semiconductor substrate on a susceptor. The susceptor with semiconductor substrate is rotated at a rotational speed effective to cause at least three radially movable substrate edge clamps on the susceptor to engage a peripheral edge of the semiconductor substrate. After and while engaging the peripheral edge of the semiconductor substrate with the at least three radially movable substrate edge clamps, rotation of the susceptor is continued while depositing a material over the semiconductor substrate.

In one implementation, a substrate susceptor for receiving a semiconductor substrate to be deposited upon comprises a body having a front substrate receiving side, a back side, and a peripheral edge. A substrate bearing surface is on the front substrate receiving side. The bearing surface comprises at least one vacuum opening configured to apply a pulling force on a semiconductor substrate received by the body against the bearing surface.

In one implementation, a method of depositing material over a semiconductor substrate comprises positioning a semiconductor substrate on a substrate bearing surface of a susceptor. The bearing surface comprises at least one vacuum opening therein. A vacuum force is applied to the at least one opening effective to apply a pulling force on the semiconductor substrate against the bearing surface. While the vacuum force is applied, the susceptor is rotated while depositing a material over the semiconductor substrate.

In one implementation, a substrate susceptor for receiving a semiconductor substrate to be deposited upon comprises a body having a front substrate receiving side, a back side, and a peripheral edge. A surface is on the front substrate receiving side over which at least a portion of a semiconductor substrate to be deposited upon is to be received. The surface comprises at least three gas emitting openings configured to apply a substrate levitating and rotating force from gas emitted from the openings effective to levitate and rotate said semiconductor substrate relative to the susceptor body.

In one implementation, a method of depositing material over a semiconductor substrate comprises positioning a semiconductor substrate over a surface of a susceptor. The surface comprises at least three gas emitting openings therein. Gas is emitted from the at least three openings effective to levitate and rotate the semiconductor substrate relative to the susceptor. While levitating and rotating the semiconductor substrate relative to the susceptor, a material is deposited over the semiconductor substrate.

Other aspects and implementations are contemplated.

BRIEF DESCRIPTION OF THE DRAWINGS

Preferred embodiments of the invention are described below with reference to the following accompanying drawings.

FIG. 3 is a diagrammatic section of an embodiment of a susceptor in accordance with an aspect of the invention, taken through line 3-3 in FIG. 4.

FIG. 4 is a top view of the FIG. 3 susceptor.

FIG. 17 is a top view of another embodiment susceptor in accordance with an aspect of the invention.

FIG. 18 is a diagrammatic section of the FIG. 17 susceptor taken through line 18-18 in FIG. 17.

FIG. 19 is a top view of the FIG. 17 susceptor in one operational configuration in accordance with-an aspect of the invention.

FIG. 20 is a diagrammatic section of the FIG. 19 susceptor taken through line 20-20 in FIG. 19.

DETAILED DESCRIPTION OF THE PREFERRED EMBODIMENTS

Figure 1:
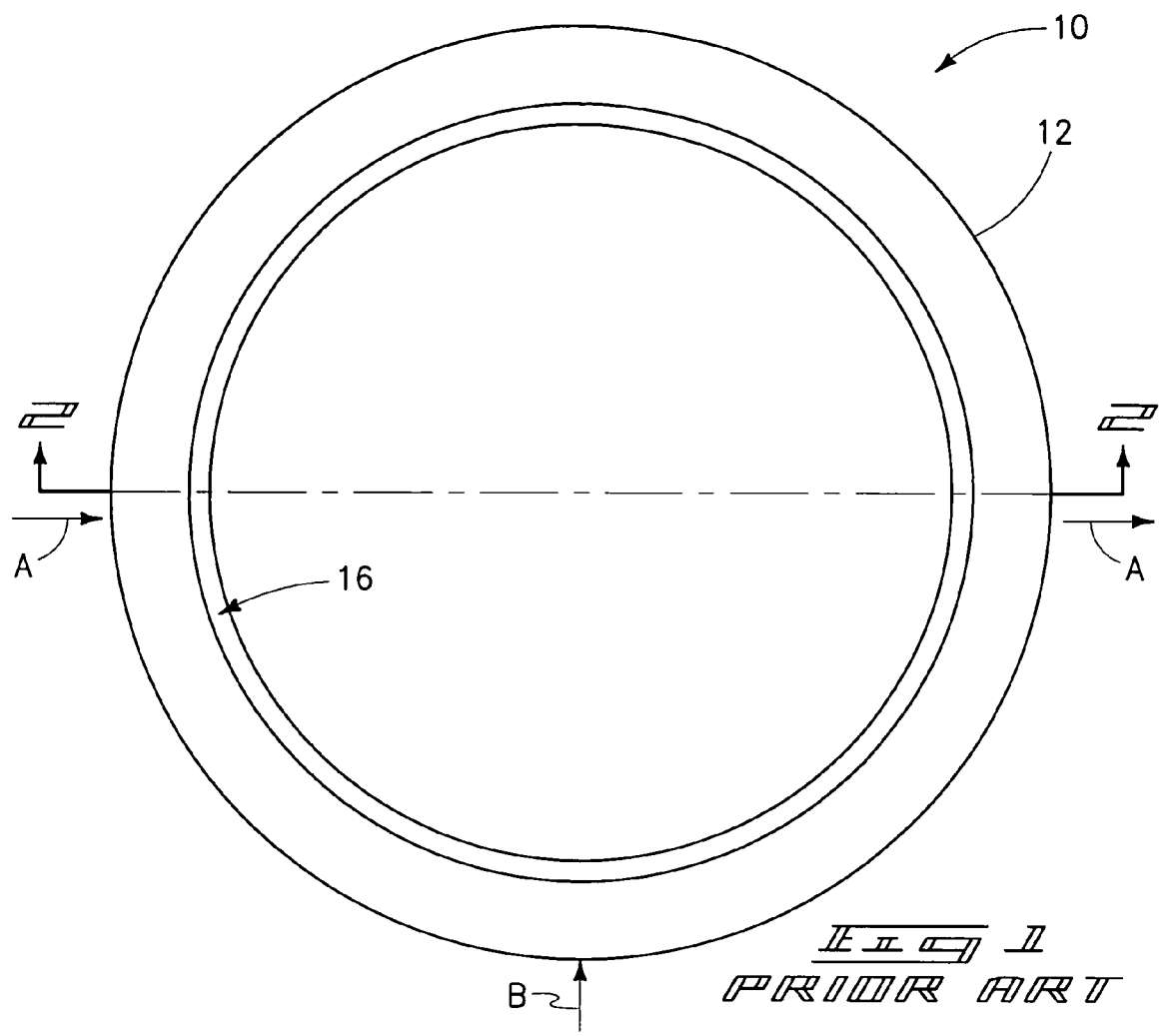
FIG. 1 is a top view of a prior art susceptor.

This disclosure of the invention is submitted in furtherance of the constitutional purposes of the U.S. Patent Laws "to promote the progress of science and useful arts" (Article 1, Section 8).

The invention comprises structural and methodical aspects, neither of which is limited by the other unless literal limiting language thereto appears in a claim under analysis.

Certain aspects of the invention are initially described with reference to FIGS. 3-6. Referring initially to FIGS. 3 and 4, a substrate susceptor for receiving a semiconductor substrate for selective epitaxial silicon-comprising depositing thereon is indicated generally with reference numeral 30. Such depositing will comprise measuring the emissivity of the susceptor from at least one susceptor location in a non-contacting manner, for example and by way of example only, by optical pyrometry using an infrared sensor. Susceptor 30 comprises a body 32 having a front substrate receiving side 34, a back side 35 and a peripheral edge 36. Front side 34 has a substrate receiving recess 38 formed therein. A substrate to be deposited upon is depicted in FIG. 3 in dashed lines, designated with numeral 31, and received within recess 38. Of course, no recess need be utilized.

At least one susceptor location from which emissivity is to be measured is received on at least one of front substrate receiving side 34, back side 35 and edge 36. By way of example only, FIG. 3 includes a bold arrow 40 depicting an exemplary path of non-contacting sensing of emissivity to/from a remote sensor (not shown). Path 40 extends to a susceptor location 42, in this example received on back side 35, from which emissivity is to be measured. Where susceptor 30 is caused to rotate, such at least one susceptor location will encompass an annulus 45 (FIG. 4). Regardless, more than a single location for emissivity sensing is of course contemplated, for example multiple discontinuous susceptor locations. Such might be in the form of multiple spaced annuluses when the susceptor rotates, or isolated spots or areas where the susceptor is not caused to rotate.

Susceptor location 42 comprises an outermost surface 43 comprising a material upon which selective epitaxial silicon will not deposit upon during selective epitaxial silicon depositing on a semiconductor substrate received by the susceptor (i.e., substrate 31) for at least an initial thickness of epitaxial silicon depositing on such substrate. Exemplary preferred materials include one or more of $SiO_2$, $Si_3N_4$, $Al_2O_3$, BN and $ZrO_2$. By way of example only, the material of outermost surface 43 might comprise, consist essentially of or consist of these or other stated materials having the stated attributes. Regardless, only a portion of the susceptor body might be comprised of the material, or all of the susceptor body might be comprised of the material. For example, the body depicted in FIG. 3 might be formed to consist essentially entirely of a material upon which selective epitaxial silicon will not deposit for at least an initial thickness of epitaxial silicon depositing on a substrate received by the susceptor.

FIG. 3 depicts susceptor body 32 as comprising different materials, for example two different materials 44 and 46. Material 46 is depicted as comprising a layer 46 which, in the preferred embodiment, is formed over all of back side 35 and upon which location 42/45 is received. Further in this example, and as would occur further by way of example only where all of the body comprised the stated material, the side or edge on which the at least one susceptor location is received comprises an outermost surface comprising such material external of location 42/45.

In the depicted example, material 44 might comprise a prior art or yet-to-be developed material. One exemplary preferred material is the prior art silicon carbide-coated graphite material described above. An exemplary preferred thickness range for material 46 is from 5,000 Angstroms to 100 microns, with from 50 microns to 100 microns being preferred.

Figure 5:
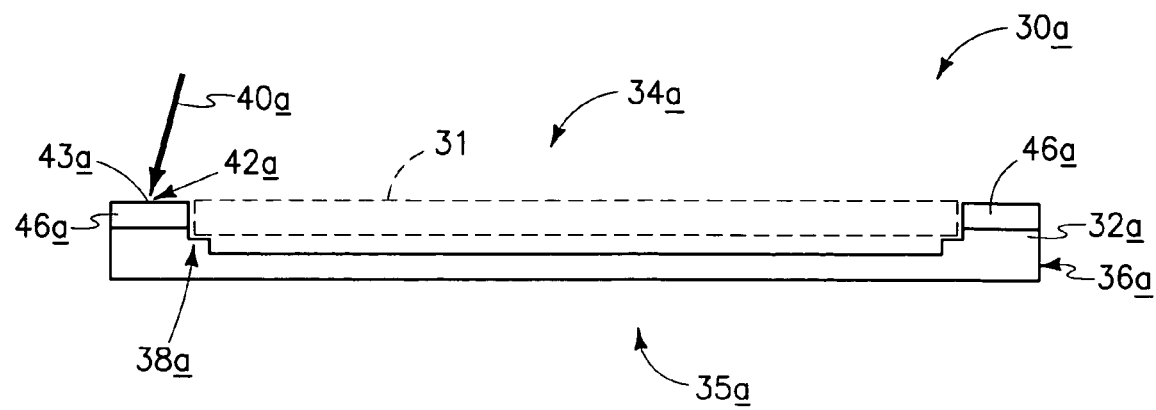
FIG. 5 is an alternate embodiment susceptor to that shown by FIG. 3.

FIGS. 3 and 4 depict the at least one susceptor location from which emissivity is to be measured as being received on back side 35. By way of example only, FIG. 5 depicts an alternate embodiment substrate susceptor 30a wherein at least one susceptor location from which emissivity is to be measured is received on front substrate receiving side 34a. Like numerals from the first-described embodiment are utilized where appropriate, with differences being indicated with the suffix "a". A layer 46a of the stated material is shown received over a peripheral area or region relative to recess 38a on front side 34a for an emissivity sensing path 40a.

Figure 6:
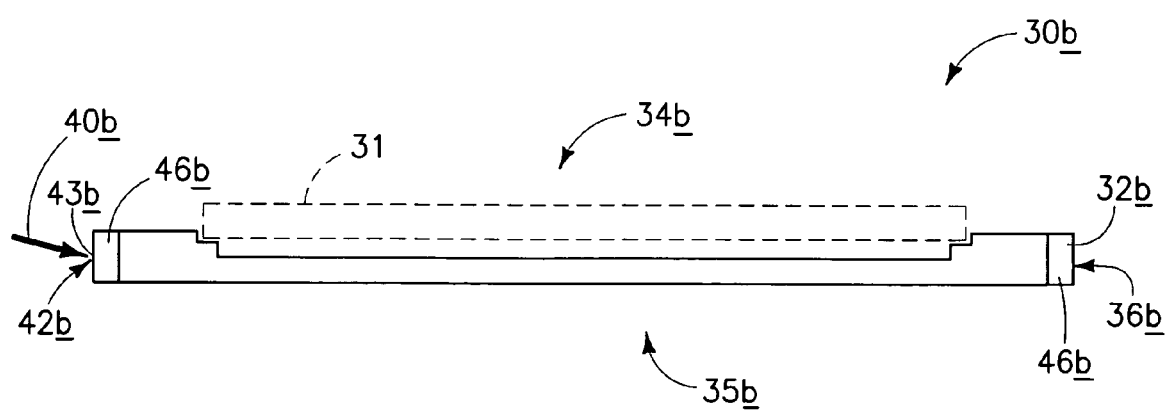
FIG. 6 is an alternate embodiment susceptor to that shown by FIG. 3.

Further by way of example only, FIG. 6 depicts a substrate susceptor 30b having at least one susceptor location from which emissivity is to be measured being received on peripheral edge 36b. Like numerals from the first-described embodiment are utilized where appropriate, with differences being indicated with the suffix "b". Here, a layer 46b of the above-stated material is received over peripheral edge 36b and comprises a location 42b from which emissivity is to be measured. Of course any of the above attributes could be combined, or the location provided as indicated or otherwise in the context of a susceptor which is substantially homogenously made of the stated material(s) upon which epitaxial silicon will not deposit. Whatever material is utilized, it is preferably stable at the selective epitaxial silicon processing temperatures (i.e., 850° C.) as well as, of course, stable to the processing gases.

Figure 7:
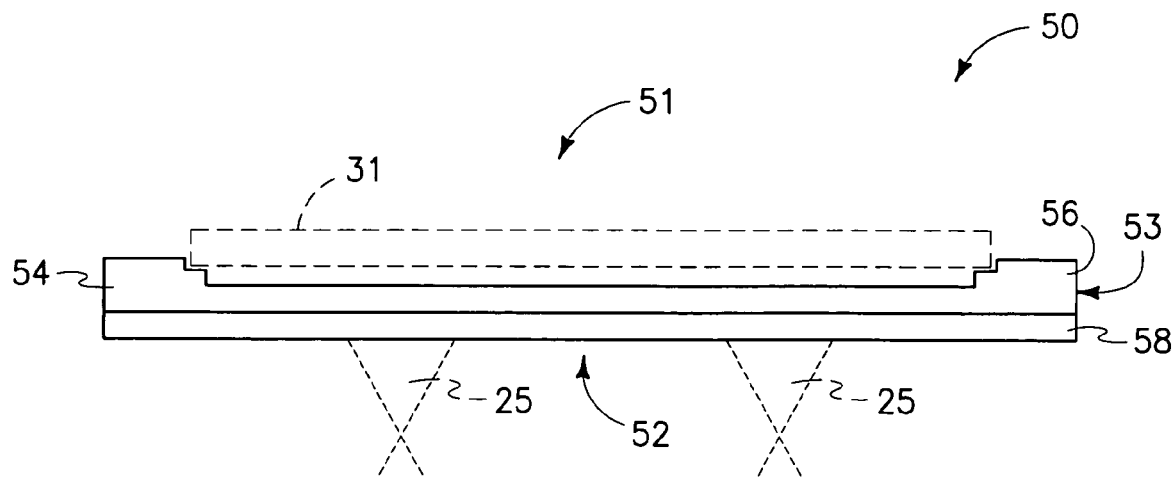
FIG. 7 a diagrammatic section of another embodiment susceptor in accordance with an aspect of the invention.

In one implementation, the invention comprises a substrate susceptor for receiving a semiconductor substrate to be deposited upon by thermal deposition which comprises susceptor back side radiant heating, for example and by way of example only, as described in the above Background section. FIG. 7 depicts one such embodiment substrate susceptor, indicated generally with reference numeral 50. Such comprises a body 54 having a front substrate receiving side 51, a back side 52 and a peripheral edge 53. Body 54 comprises multiple materials having at least two different thermal conductivities, for example materials 56 and 58.

Material 58 comprises an outer material received across back side 52 and which has a higher thermal conductivity than an immediately adjacent material of body 54, specifically in this example that portion of material 56 which contacts outer material 58. In the context of this document, "outer" in the context of "outer material" or "outer portion" requires a material or portion that is at least received in an outermost half portion of the medial front or back half of the susceptor body, in other words received at least in the front side or back side outermost one quarter of the maximum body thickness. In one implementation, outer material 58 comprises at least one of copper and polycrystalline diamond. In one implementation, the outer material is not received over an outer portion of any of the front substrate receiving side. In one implementation, outer material 58 has a thermal conductivity which is at least three times higher than that of an immediately adjacent material of the body. In one implementation, the body comprises SiC-coated graphite. For example, and by way of example only, material 56 might consist essentially of SiC-coated graphite. Outer material 58 is received across back side 52 over the SiC, and has a higher thermal conductivity than that of the SiC and the graphite.

By way of example only, polycrystalline diamond can be deposited utilizing $H_2$ and $CH_4$ in a microwave plasma at 700° C.-800° C. at from 30 Torr to 3,000 Torr. Further by way of example only, copper can be deposited by sputter deposition from a copper target. Polycrystalline diamond has a thermal conductivity typically between 1,500 and 2,500 W/mK, while copper typically has a thermal conductivity of 390 W/mK.

Figure 8:
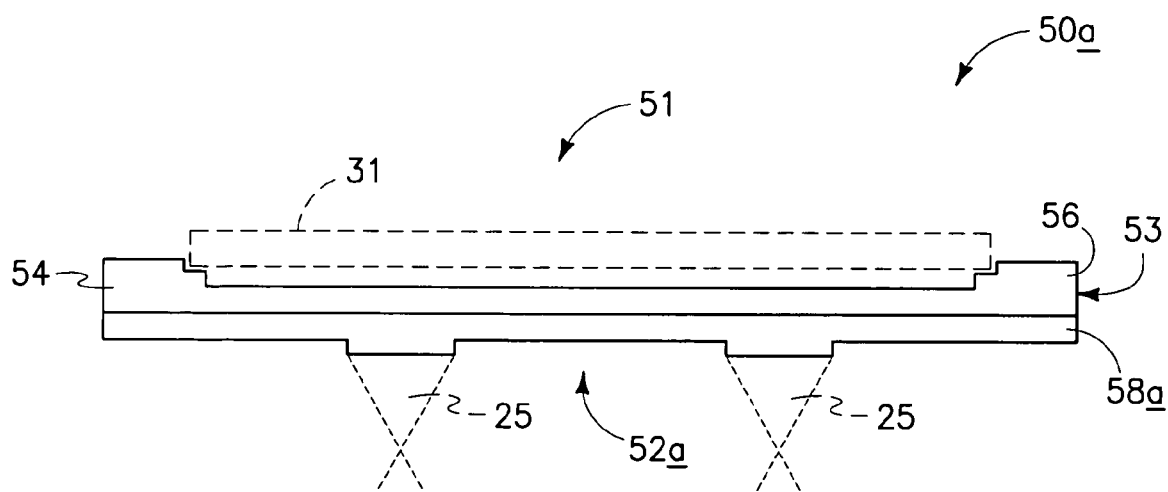
FIG. 8 is an alternate embodiment susceptor to that shown by FIG. 7.

FIG. 7 depicts one preferred embodiment where outer material 58 comprises the outermost material relative to back side 52. Further in the illustrated FIG. 7 embodiment, material 58 is of uniform thickness across back side 52. An exemplary preferred thickness is from 500 Angstroms to 100 microns, with a more preferred thickness range being from 500 Angstroms to 1 micron. By way of example only, FIG. 8 depicts an alternate embodiment substrate susceptor 50a having an outer material 58a of non-uniform thickness. Preferred thickness ranges for the depicted maximum and minimum thickness areas are each as described above in connection with the FIG. 7 embodiment.

Figure 2:
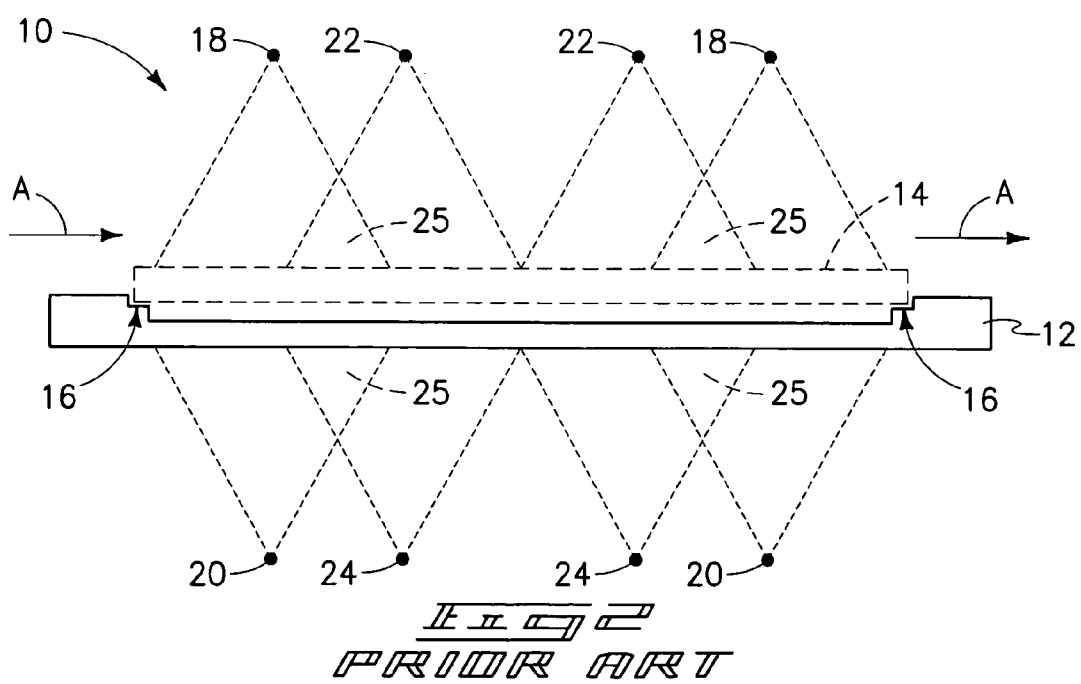
FIG. 2 is a diagrammatic section of the FIG. 1 susceptor taken through line 2-2 in FIG. 1.

In utilizing a preferred higher thermal conductivity material on the susceptor back side, such embodiment(s) might result in improved temperature uniformity of a substrate received by the susceptor in the context of back side radiant heating. For example, and by way of example only, consider a process and equipment where incident back side radiant heating includes an overlap area 25 on the back side of the susceptor as depicted and described in connection with FIG. 2. In one implementation, layer 58 might improve temperature uniformity across a substrate received by the susceptor than would otherwise occur under identical conditions in the absence of an outer material being received across the susceptor back side which has higher thermal conductivity than immediately adjacent material of the body.

Figure 9:
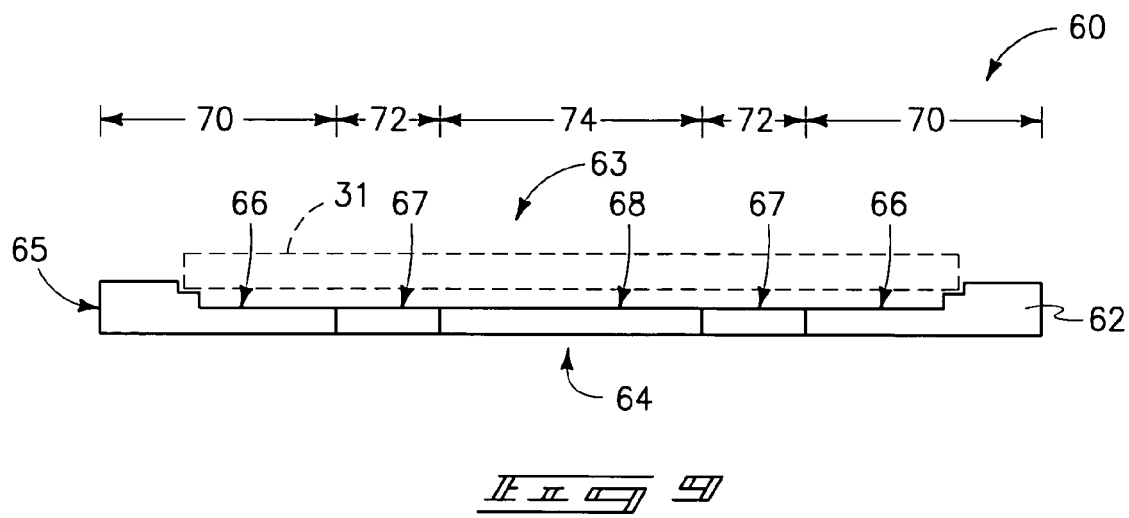
FIG. 9 is a diagrammatic section of another embodiment susceptor in accordance with an aspect of the invention, taken through line 9-9 in FIG. 10.
Figure 10:
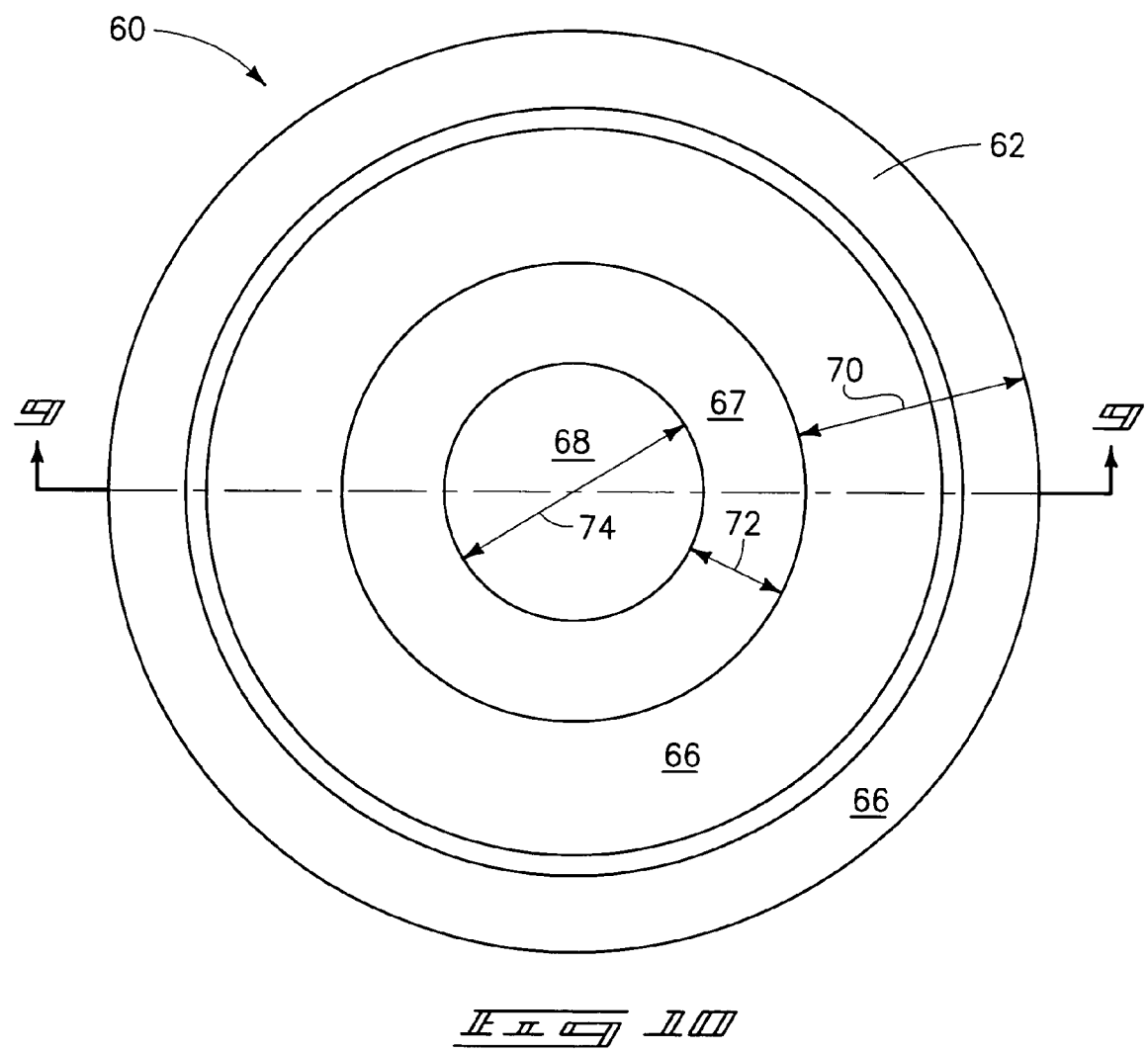
FIG. 10 is a top view of the FIG. 9 susceptor.

In one implementation, the invention encompasses a substrate susceptor for receiving a semiconductor substrate to be deposited upon by thermal deposition which comprises heating of the susceptor. By way of example only, such heating might be by the lamp heating described above or by some form of resistive or other heating wherein at least some desired heat transfer effect is occurring from the susceptor to a substrate received by the susceptor for deposition thereupon. FIGS. 9 and 10 depict one implementation of such a substrate susceptor, indicated generally with reference numeral 60. Such comprises a body 62 having a front substrate receiving side 63, a back side 64 and a peripheral edge 65.

In one implementation, body 62 comprises multiple materials 66, 67 and 68 which have at least two different thermal conductivities and are received at different radial locations and are not received across an entirety of either the body front side or the body back side. In the depicted preferred embodiment, susceptor body 62 (as in preferred embodiments of all of the above-described susceptors) is round. Materials 66 and 68 might comprise the same material, with material 67 comprising a material having different thermal conductivity than that of material 66/68. Accordingly in such instance, and by way of example only, the stated multiple materials constitute only two different materials. Further by way of example only, materials 66, 67 and 68 might each comprise different materials having different thermal conductivities whereby the stated multiple materials number three. Further in one implementation, more than three materials might be utilized.

By way of example only, an exemplary lower thermal conductive material comprises graphite, including a mass of silicon carbide-coated graphite. Further by way of example only, a higher thermal conductivity material comprises at least one of copper and polycrystalline diamond.

FIGS. 9 and 10 depict substrate susceptor 60 as might be configured in exemplary embodiments as described above for rotation while receiving a substrate for deposition thereupon. Substrate susceptor 60 depicts different radial locations 70, 72 and 74. In the depicted preferred embodiment, such radial locations are continuous about some portion of an arc, preferably at least 10 percent of the circumference of the susceptor body. In the illustrated embodiment, radial locations 70 and 72 are continuous about two annuluses. Further in the depicted preferred embodiment, at least one of materials 66, 67 and 68 is received on an outermost surface of at least one of front side 63 and back side 64, with all such materials 66, 67 and 68 extending from front side 63 to back side 64, and regardless being received on the outermost surface of front side 63 and back side 64.

In one implementation, multiple different thermally conductive materials might be utilized to contend with hotter and colder areas of the substrate towards improving temperature uniformity. For example in the depicted embodiment and in connection with the hotter overlapping portions of the prior art as well as the colder central and peripheral regions, material 67 might be comprised of a lower thermally conductive material as compared to materials 66 and 68. Accordingly, materials 66 and 68 could comprise one or more higher thermally conductive material(s), preferably providing more substrate temperature uniformity of the substrate being deposited upon than would otherwise occur under identical conditions in the absence of such multiple different thermal conductivity materials.

In one implementation, a substrate susceptor for receiving a semiconductor substrate to be deposited upon by thermal deposition comprising heating of the susceptor includes a body 62 comprising a peripheral-most region 70 preferably comprising at least 10 percent of the radius of susceptor 60. Body 62 comprises an inner region such as, by way of example only, region 72, region 74, or a combination of regions 72 and 74. In one implementation, and by way of example only, region 72 can be considered as a first region received radially inward of peripheral-most region 70, and region 74 can be considered as a second region received radially inward of first region 72, and by way of example. Regardless, body 62 comprises multiple materials having at least two different thermal conductivities.

In one implementation, the peripheral-most region and the inner region have different average thermal conductivities. In one implementation, first region 72 has an average thermal conductivity which is different from an average thermal conductivity of second region 74. Of course, the thermal conductivities of such respective regions could be either higher or lower than the other. The stated regions might respectively be homogeneous or comprise multiple different materials and layers having the same or at least two different thermal conductivities.

Figure 11:
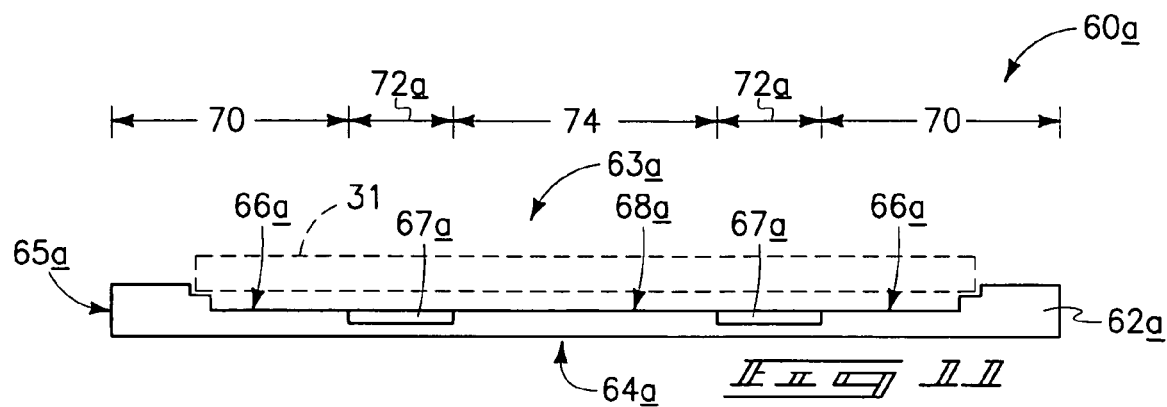
FIG. 11 is an alternate embodiment susceptor to that shown by FIG. 9.

By way of example only, FIG. 11 depicts an alternate embodiment substrate susceptor 60a for receiving a semiconductor substrate to be deposited upon by thermal deposition comprising heating of the susceptor. Like numerals from the FIGS. 9 and 10 embodiment are utilized where appropriate, with differences being indicated with the suffix "a". In the depicted exemplary embodiment, material 67a does not extend from front side 63a to back side 64a. Alternate exemplary embodiments are also contemplated, for example different thermal conductivity materials embedded centrally or otherwise within material of a different thermal conductivity (not shown).

Figure 12:
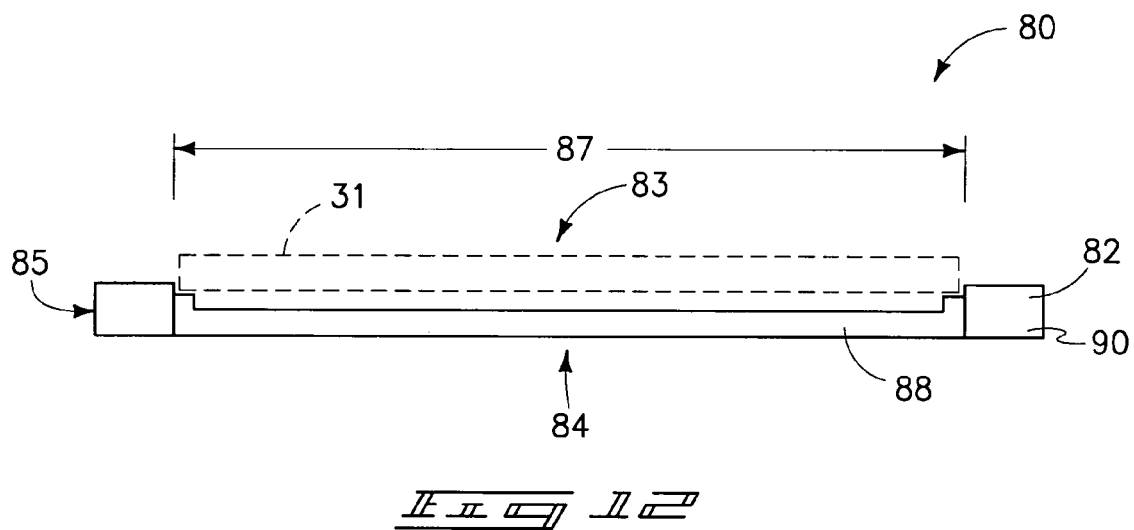
FIG. 12 is a diagrammatic section of another embodiment susceptor in accordance with an aspect of the invention.

In one implementation, the invention comprises a substrate susceptor for receiving a semiconductor substrate to be deposited upon, for example and by way of example only, as is indicated generally with reference numeral 80 in FIG. 12. Susceptor 80 comprises a body 82 having a front substrate receiving side 83, a back side 84 and a peripheral edge 85. Body 82 comprises at least one solid portion therethrough that is transparent to infrared radiation. In the context of this document, a wall which is transparent to infrared radiation passes at least 75% of incident infrared radiation therethrough. By way of example: only, exemplary preferred materials include silicon dioxides and sapphire.

Figure 13:
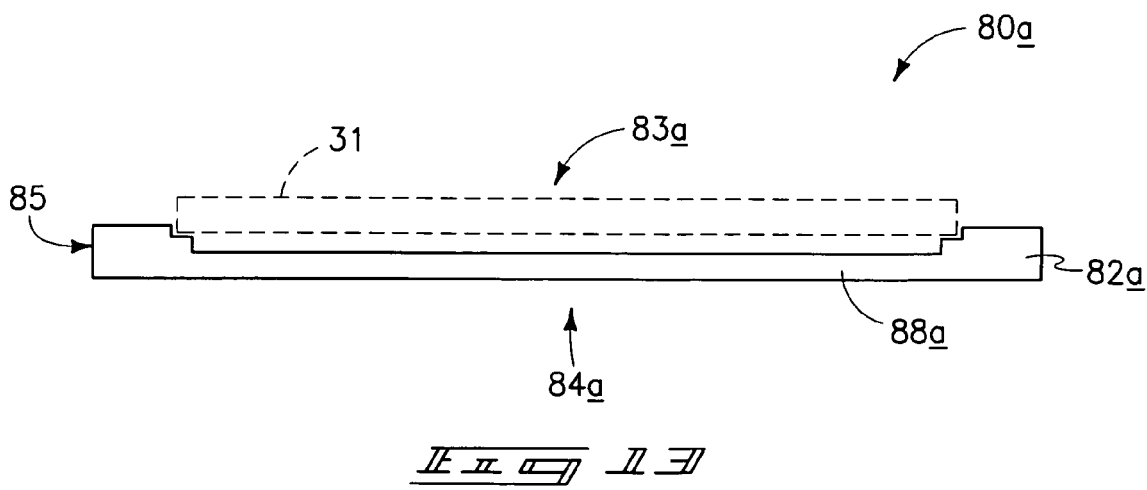
FIG. 13 is an alternate embodiment susceptor to that shown by FIG. 12.

FIG. 12 depicts body 82 as comprising a transparent material portion 88 and a substantially infrared opaque portion 90 (i.e., SiC-coated graphite). A substrate 31 to be deposited upon is shown received by susceptor 80, with susceptor 80 thereby comprising a substrate area 87 over or within which substrate 31 is received. In the depicted exemplary preferred embodiment of FIG. 12, solid portion 88 is transparent to infrared radiation over at least all of substrate area 87. FIG. 12 depicts an embodiment wherein only a single solid portion of body 82 is transparent to infrared radiation, and wherein only a portion of body 82 is transparent to infrared radiation. Of course, multiple discrete solid portions through a susceptor body that are transparent to infrared radiation might also be employed. Further by way of example only, FIG. 13 depicts an alternate embodiment substrate susceptor 80a wherein the entire body is encompassed by material that is transparent to infrared radiation. Like numerals from the FIG. 12 described embodiment are utilized where appropriate, with differences being indicated with the suffix "a".

An aspect of the invention also includes a method of depositing a material over a semiconductor substrate. In one implementation, a semiconductor substrate is positioned on a susceptor, where the susceptor has at least one solid portion therethrough that is transparent to infrared radiation and over which the semiconductor substrate is received. For example and by way of example only, FIG. 12 depicts such a susceptor 80. A material is deposited over the substrate. During such depositing, substrate temperature is detected by measuring substrate emissivity from a back side of the semiconductor substrate through at least one infrared radiation transparent portion of the susceptor from a back side of the susceptor using a non-contacting emissivity sensor. For example, a pyrometric measurement as described above in connection with the first-described embodiment could be utilized from susceptor back side 84 through transparent portion 88 to and from the back side of substrate 31 received by susceptor 80.

In one implementation, a method of depositing a material over a semiconductor substrate comprises positioning a semiconductor substrate on a susceptor. The susceptor has at least one solid portion therethrough that is transparent to infrared radiation and over which the semiconductor substrate is received. A material is deposited over the semiconductor substrate. During the depositing, radiant energy is impinged onto the susceptor back side through the transparent solid portion effective to heat the semiconductor substrate being deposited upon.

By way of example only, preferred materials for deposition include silicon materials, for example amorphous, monocrystalline, and/or polycrystalline silicon, including mixtures thereof with germanium. Exemplary equipment includes the prior art equipment utilized and described above comprising back side radiant heating with a transparent portion susceptor as described in connection with FIGS. 12 and 13. Existing technology typically relies upon the susceptor to absorb infrared energy from lamps which heat the chamber then radiate the heat to the wafer and, in time equilibrate with the susceptor. By one or both of detecting the substrate temperature by measuring substrate emissivity through a transparent portion of the susceptor or by heating the semiconductor substrate through an infrared transparent portion of the susceptor, improved heating and actual substrate temperature measurements might be obtained.

Figure 14:
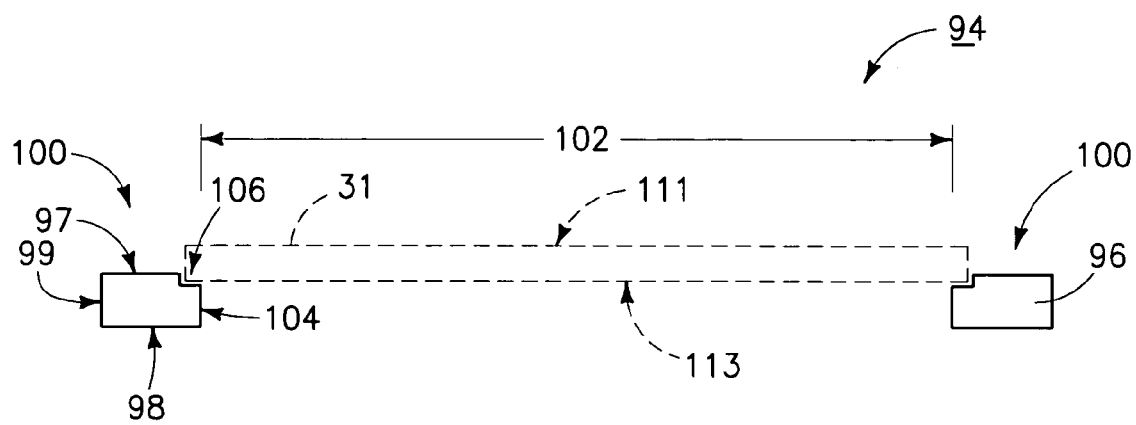
FIG. 14 is a diagrammatic section of another embodiment susceptor in accordance with an aspect of the invention, taken through line 14-14 in FIG. 15.
Figure 15:
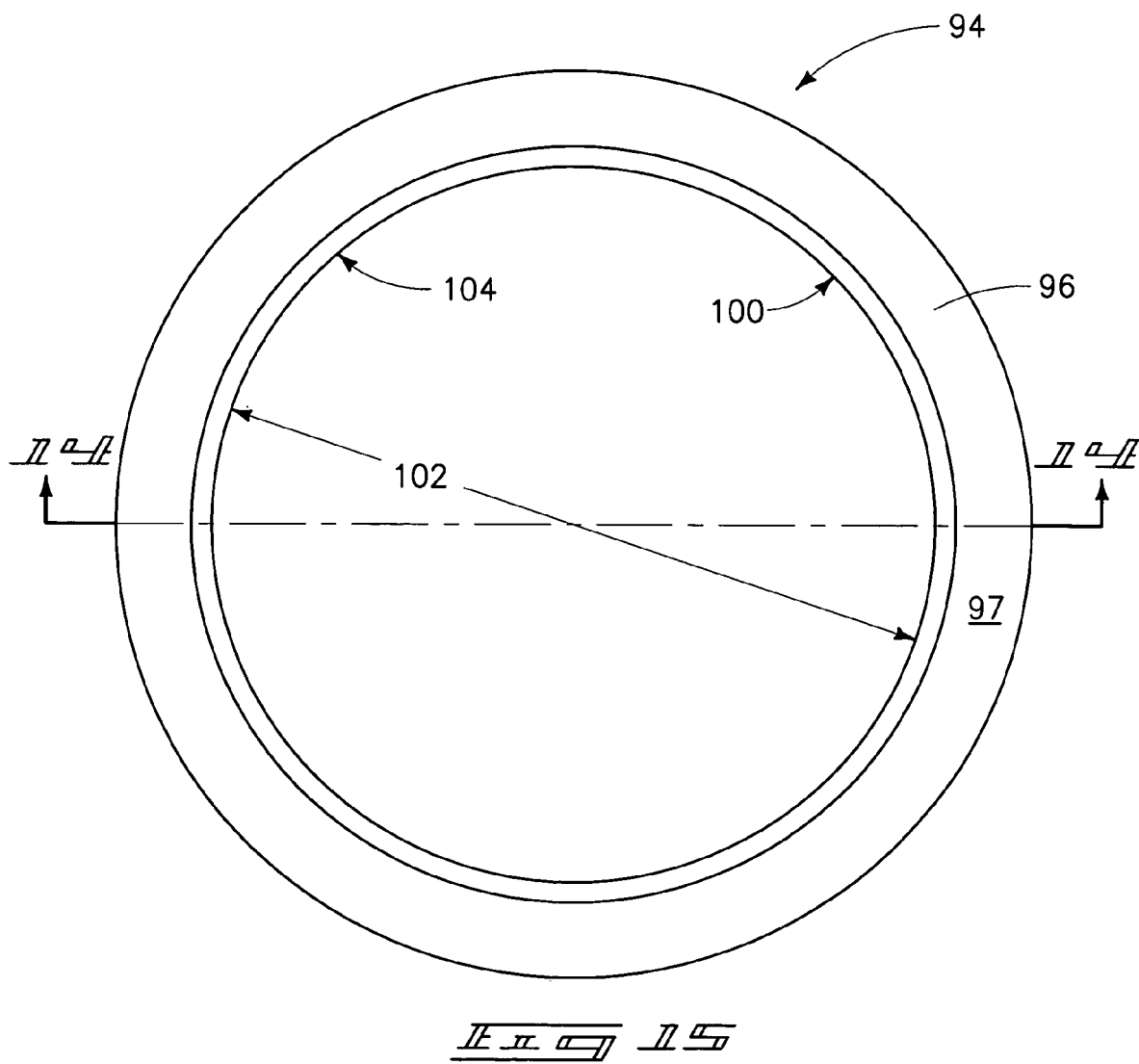
FIG. 15 is a top view of the FIG. 14 susceptor.

In one implementation, the invention encompasses a substrate susceptor for receiving a semiconductor substrate to be deposited upon, by way of example only as depicted in FIGS. 14 and 15, and indicated generally with reference numeral 94. Substrate susceptor 94 comprises a body 96 having a front substrate receiving side face 97, a back side face 98 and a peripheral edge 99. Body 96 comprises a ring 100 having a radial inner portion 102 at least a radial majority of which is non-solid space extending from front side face 97 to back side face 98. In the depicted exemplary embodiment, ring 100 has an inner surface 104 which is continuous and round. Further in the exemplary embodiment, radial inner portion 102 is centered relative to body 96. Further, susceptor 94 is configured for receipt of a substrate 31 to extend peripherally beyond non-solid space 102. In the depicted embodiment, such is accommodated for by means including a recess 106.

Where a susceptor is configured for receipt of a substrate to extend peripherally beyond the non-solid space, preferably at least a majority of the substrate overlies non-solid space, more preferably at least 90 percent, and even more preferably at least 95 percent overlies non-solid space.

Figure 16:
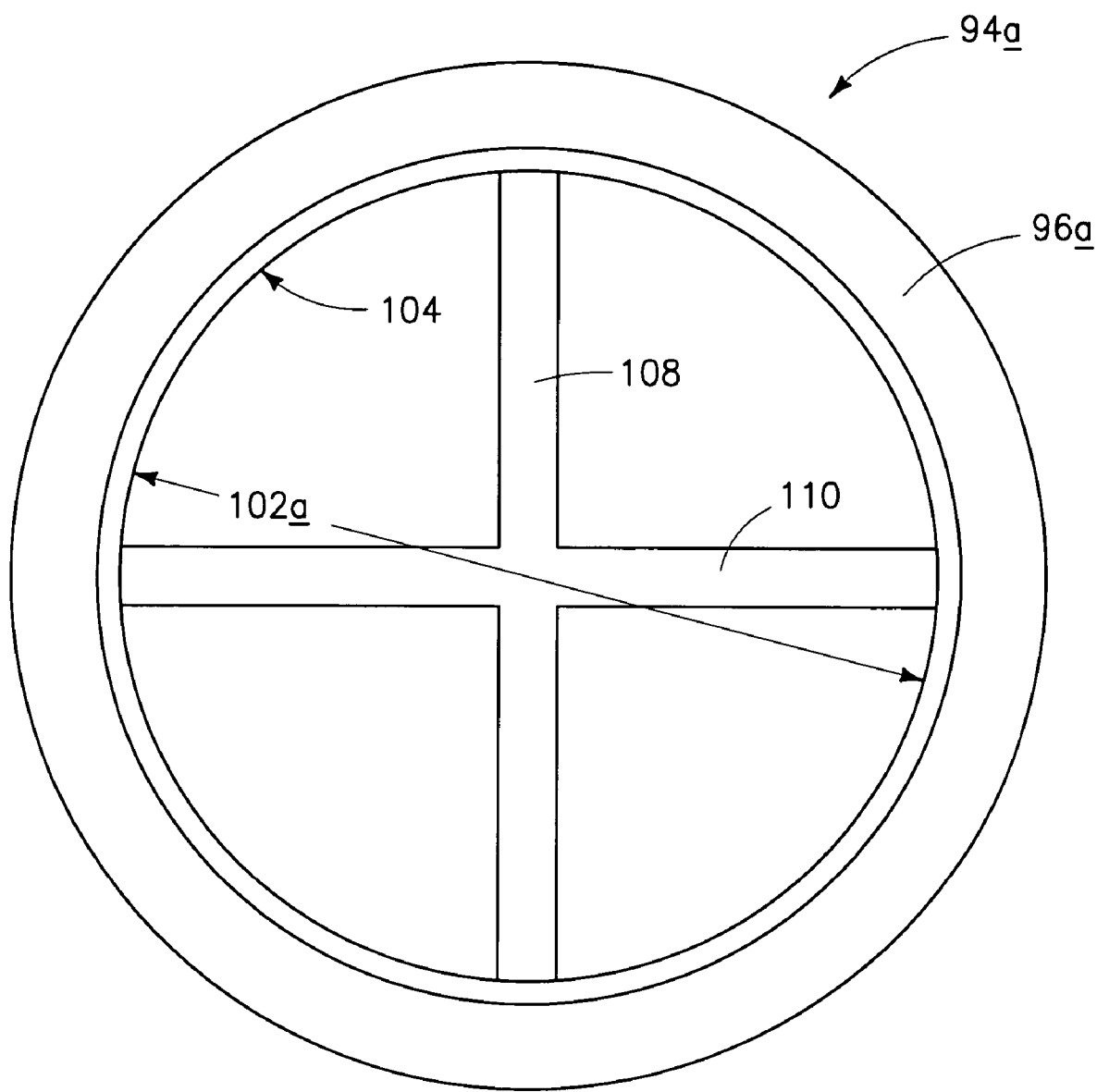
FIG. 16 is an alternate embodiment susceptor to that shown by FIG. 15.

FIGS. 14 and 15 depict a substrate susceptor wherein all of radial inner portion 102 is non-solid. By way of example only, an alternate, lesser preferred, embodiment substrate susceptor 94a is depicted in FIG. 16. Like numerals from the first-described embodiment are utilized where appropriate, with differences being indicated with the suffix "a" or with different numerals. Substrate susceptor 94a comprises a radial inner portion 102a having cross pieces 108 and 110 extending thereacross. Such might be opaque to any incident infrared radiation employed from the back side of the substrate, or of course might be transparent thereto.

Aspects of the invention include a method of depositing an elemental silicon comprising material over a semiconductor substrate. In one implementation, a semiconductor substrate is positioned on a susceptor, for example substrate 31 positioned relative to susceptor 94 in FIG. 14. Semiconductor substrate 31 can be considered as comprising a front side 111 and a back side 113. An elemental silicon comprising material is deposited at least on the substrate front side, with exemplary materials being as described above of silicon in any of amorphous and/or crystalline forms, including by way of example only a mixture of silicon with other materials, such as germanium. During the depositing, radiant energy is impinged onto substrate 31 backside 113 through a radial inner non-solid portion of the susceptor.

In one implementation, the invention encompasses a method of selectively depositing an epitaxial silicon comprising material over a semiconductor substrate. A semiconductor substrate is positioned on a susceptor, for example semiconductor substrate 31 positioned on susceptor 94 or 94a. Semiconductor substrate back side 113 comprises an exposed material other than monocrystalline silicon. An epitaxial silicon-comprising material is selectively deposited on at least some portion of front side 111 of semiconductor substrate 31 as compared to back side 113 of semiconductor substrate 31 which is exposed through the radial inner non-solid portion 102 of the susceptor during the depositing. By way of example, the exposed back side material might encompass any of $SiO_2$, $Si_3N_4$, $Al_2O_3$, BN and $ZrO_2$.

In one implementation, the invention comprises a substrate susceptor for receiving a semiconductor substrate to be deposited upon, for example and by way of example only, as indicated with reference numeral 120 in FIGS. 17-20. Substrate susceptor 120 has a body 121 comprising a front substrate receiving side 122, a back side 124 and, a peripheral edge 126. At least three movable substrate edge clamps are associated with the body, and are positioned to engage a peripheral edge of a semiconductor substrate received by the body for deposition thereupon. For example, FIGS. 17 and 18 depict a substrate 31 to be deposited upon comprising a peripheral edge 127 (FIG. 18). Four movable substrate edge clamps 130 are received over front side 122, and shown in a non-engaging position relative to substrate 31 in FIGS. 17 and 18. Edge clamps 130 comprise a pivot shaft 132 extending through body 121 with, in the depicted exemplary embodiment, shaft 132 being formed about or defining a pivot axis 123 to which individual clamping devices or portions are mounted/received for clamping engagement relative to substrate 31. Susceptor body 121 comprises a rotation axis 136 about which susceptor 120 rotates, and which is preferably parallel with the pivot axis 123 of shaft 132.

Substrate edge clamps 130 comprise clamping portions 138 extending from shaft 132 over susceptor body front side 122. Such comprise a ramped engaging surface 140 configured to impart a downward force component upon engagement of the clamping portion with substrate 31, for example as shown in FIG. 20. In the depicted preferred embodiment, ramped engaging surface 140 also extends over a top surface of substrate 31 when engaged. A counter-arm 142, different from clamping portion 138, extends from shaft 132. Counter-arm 142 has greater mass than that of clamping portion 138. In the depicted preferred embodiment, counter arm 142 is received opposite clamping portion 138 on the opposite side of body 121. Upon rotation of susceptor 120 above some minimal rotational speed, centrifugal force forces counter-arm 142 radially outward, thereby rotating shaft 132 causing clamping portions 138 to move radially inward. The depicted preferred embodiment can thereby provide both a radially retaining and a downward force against substrate 31, and which will also tend to center substrate 31 relative to susceptor body 121. Such provides but one example of how clamps might be configured in one preferred embodiment to automatically move into substrate engagement by rotating action of a susceptor about a rotation axis at a rotational speed above some minimum.

By way of example only, the depicted exemplary embodiment is shown without any substrate receiving recess being formed relative to body 121. Alternately of course, a substrate receiving recess could additionally be utilized with, in one preferred exemplary embodiment, clamps 130 being mounted for engagement elevationally outward of such recess (not shown in FIGS. 17-20), for example relative to the recesses shown in other embodiments herein.

In one implementation, the invention contemplates a method of depositing material over a semiconductor substrate which comprises positioning a semiconductor substrate on a susceptor. By way of example only, substrate 31 in FIGS. 17 and 18 is such an exemplary substrate received on an exemplary susceptor 120. A peripheral edge of the semiconductor substrate is engaged with at least three radially movable substrate edge clamps on the susceptor. The susceptor with semiconductor substrate is caused to rotate. Material is deposited over the semiconductor substrate while the semiconductor substrate is engaged with the substrate edge clamps. The initial engagement relative to the edge clamps might occur before or upon rotation of the susceptor. By way of example only, FIG. 19 depicts exemplary substrate edge engagement of substrate edge clamps 130 with substrate 31. Of course, the edge clamps might be configured for any engaging movement other than rotation or pivoting about an axis, for example and by way of example only by radially linear sliding movement. Any/all of the other above-described attributes might be employed in the context of this aspect of the invention.

In one implementation, the invention encompasses a method of depositing material over a semiconductor substrate which includes positioning a semiconductor substrate on a susceptor. The susceptor with a semiconductor substrate thereon is rotated at a rotational speed effective to cause at least three radially movable substrate edge clamps on the substrate to engage a peripheral edge of the semiconductor substrate. After and while engaging the peripheral edge of the semiconductor substrate with the at least three radially movable substrate edge clamps, rotation of the susceptor is continued while depositing a material over the semiconductor substrate.

Figure 21:
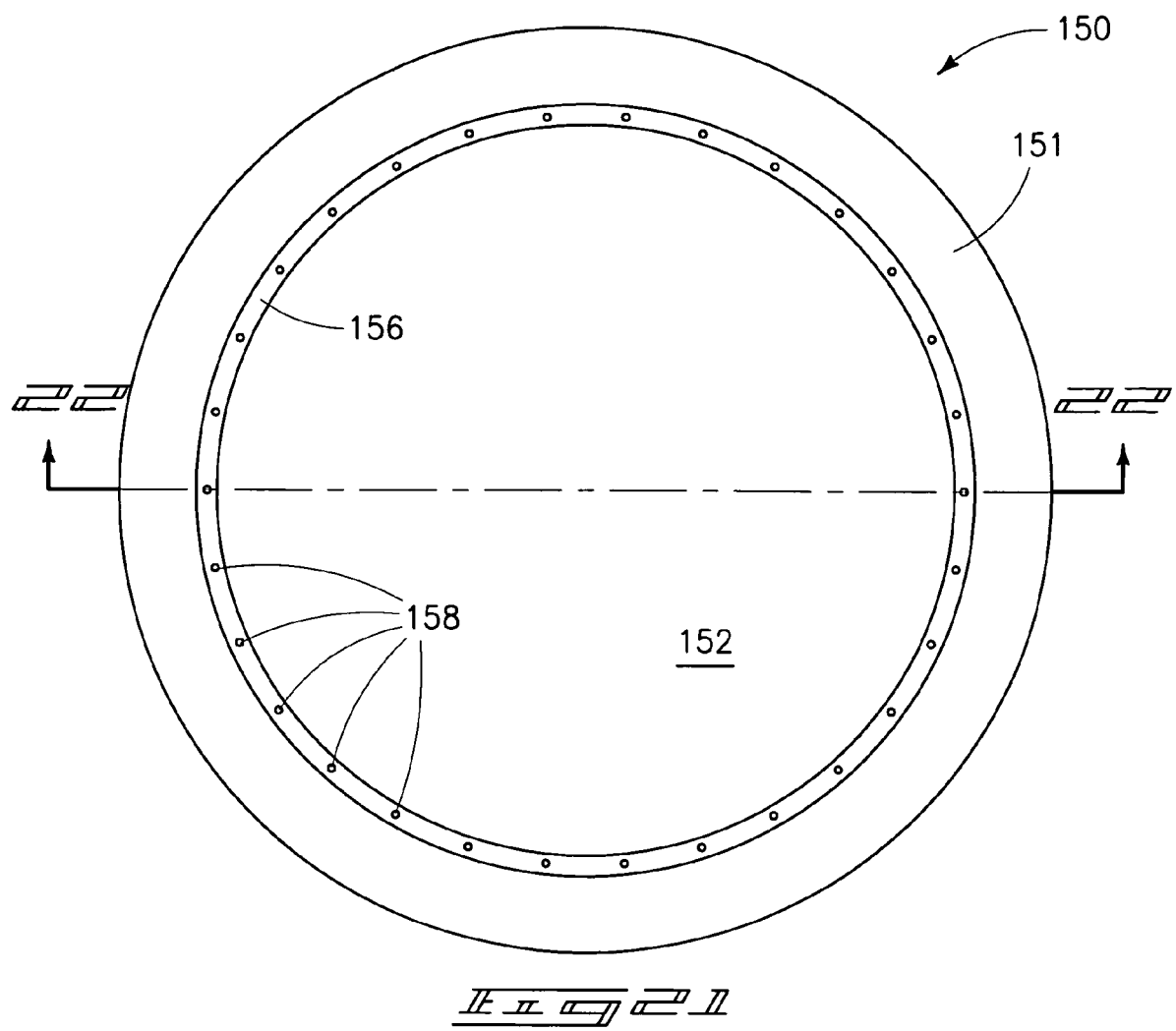
FIG. 21 is a top view of another embodiment susceptor in accordance with an aspect of the invention.
Figure 22:
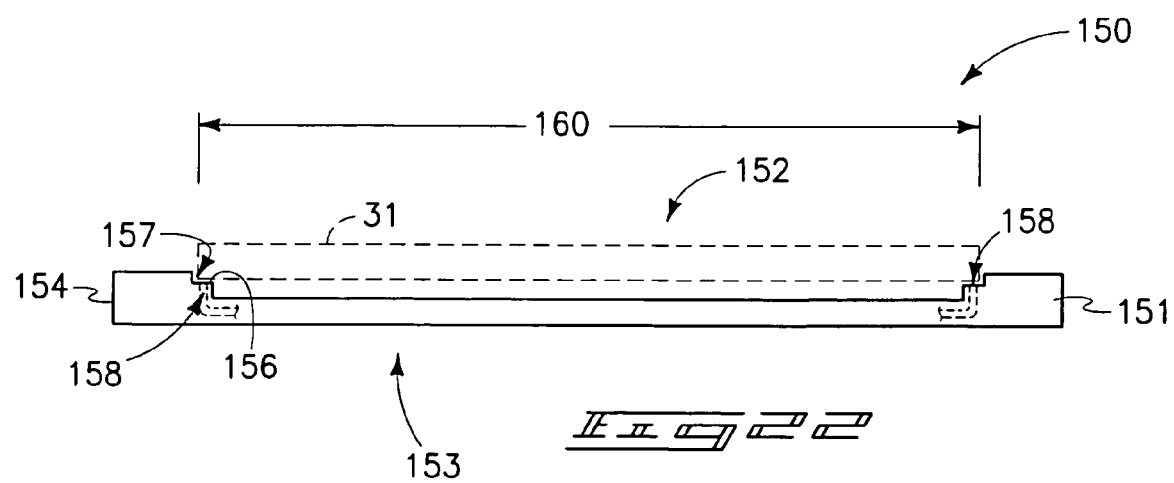
FIG. 22 is a diagrammatic section of the FIG. 21 susceptor taken through line 22-22 in FIG. 21.

In one implementation, the invention comprises a substrate susceptor for receiving a semiconductor substrate to be deposited upon, for example and by way of example only, as indicated with reference numeral 150 in FIGS. 21 and 22. Substrate susceptor 150 comprises a body 151 having a front substrate receiving side 152, a back side 153 and a peripheral edge 154. Front substrate receiving side 152 comprises a substrate bearing surface 156. In the depicted embodiment, bearing surface 156 comprises a base of a substrate receiving recess 157. Bearing surface 156 comprises at least one vacuum opening 158 configured to apply a pulling force on a semiconductor substrate (i.e., semiconductor substrate 31) received by the body against bearing surface 156, for example while the susceptor rotates.

In the depicted exemplary embodiment, substrate 31 to be deposited upon is received over an area 160 defined by the total occupying area of substrate 31. In this exemplary embodiment, bearing surface 156 comprises less than a majority of area 160, and preferably less than 10 percent of area 160. Opening or openings 158 might constitute a plurality of equally or not equally spaced openings, for example trenches, circular openings, square openings, etc. Further, vacuum opening(s) 158 could be encompassed by a single elongated or trough-like opening extending about or over much of bearing surface 156. Openings 158 extend via passageways and connect to a vacuum source (not shown) external of susceptor 150 for applying a suitable vacuum pulling force to the openings as described. Any suitable existing or yet-to-be developed rotary coupling could be utilized for configuring rotary and stationary engagement relative to a vacuum line. Preferably, the passageways or conduits would join into a single conduit relative to which the vacuum pressure would be applied.

Figure 23:
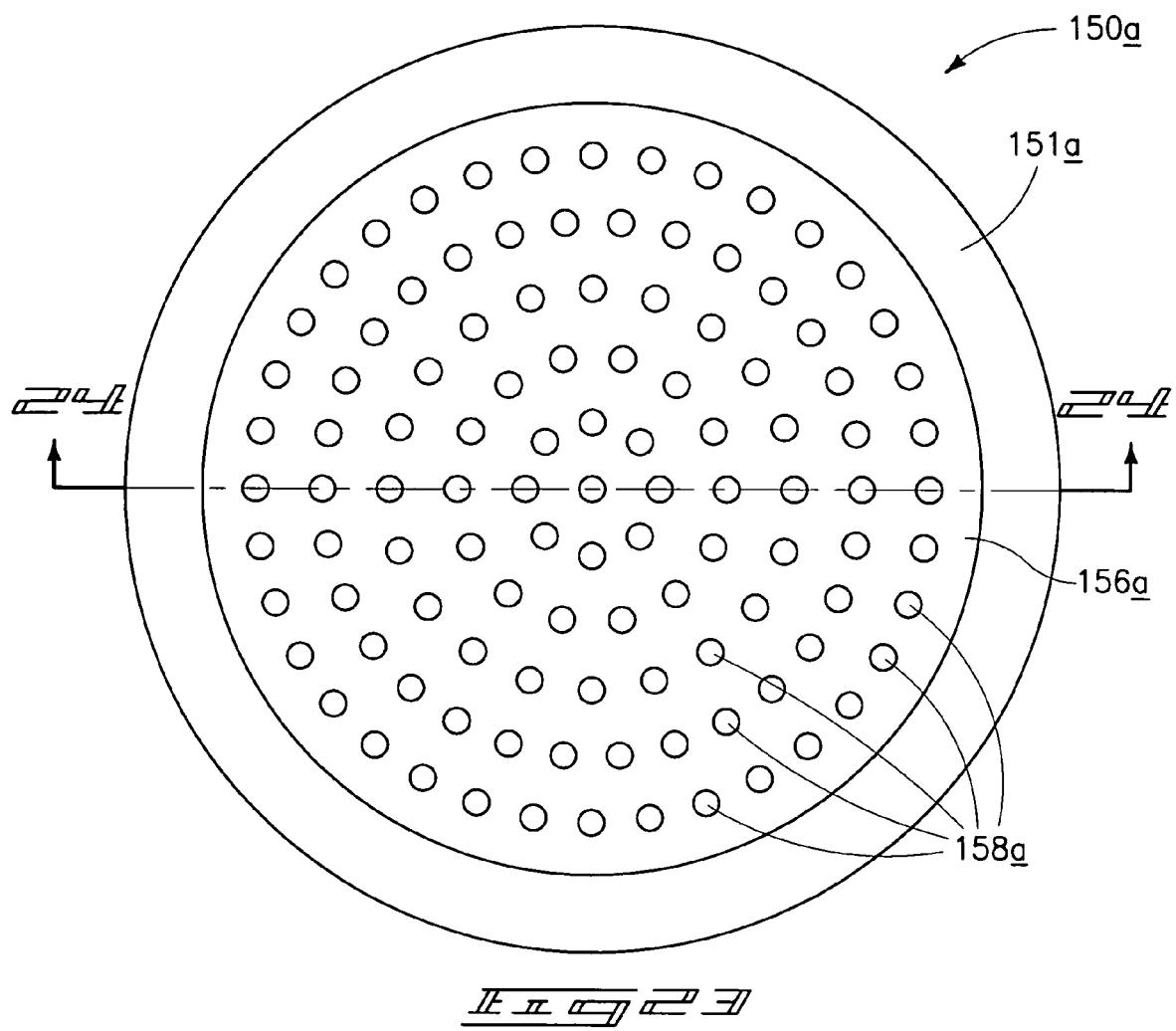
FIG. 23 is a top view of another embodiment susceptor in accordance with an aspect of the invention.
Figure 24:
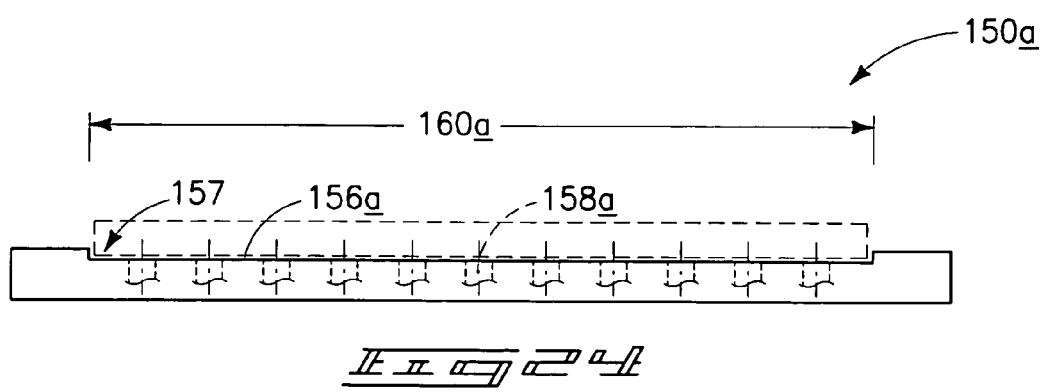
FIG. 24 is a diagrammatic section of the FIG. 23 susceptor taken through line 24-24 in FIG. 21.

By way of example only, an alternate embodiment substrate susceptor 150*a* for receiving a semiconductor substrate to be deposited upon is shown in FIGS. 23 and 24. Like numerals from the first described embodiment are utilized where appropriate, with differences being indicated with the suffix "a". Here, bearing surface 156*a* encompasses at least a majority of substrate area 160*a*, with FIG. 23 depicting bearing surface 156*a* encompassing all of substrate surface 160*a*. A plurality of openings 158*a* are shown distributed over bearing surface 156*a*, and which are configured to apply a suitable pulling force on a semiconductor substrate received by the body against bearing surface 156*a*.

The above two exemplary embodiments depict bearing surface 156 and 156*a* as encompassing a portion of a recess, although such is clearly not required in the broadest aspects of this portion of the invention. By way of example only, bearing surface 156*a* might be a flat surface flush with a top or other surface of the susceptor body, or a surface projecting therefrom.

In one implementation, an aspect of the invention encompasses a method of depositing material over a semiconductor substrate which comprises positioning a semiconductor substrate on a substrate bearing surface of a susceptor, for example either of susceptors 150 or 150*a*. Such bearing surface comprises at least one vacuum opening therein. A vacuum force is applied to the at least one opening effective to apply a pulling force on the semiconductor substrate against the bearing surface. While such vacuum force is applied, the susceptor is rotated while depositing material over the semiconductor substrate. Preferred attributes are otherwise as described above.

Figure 25:
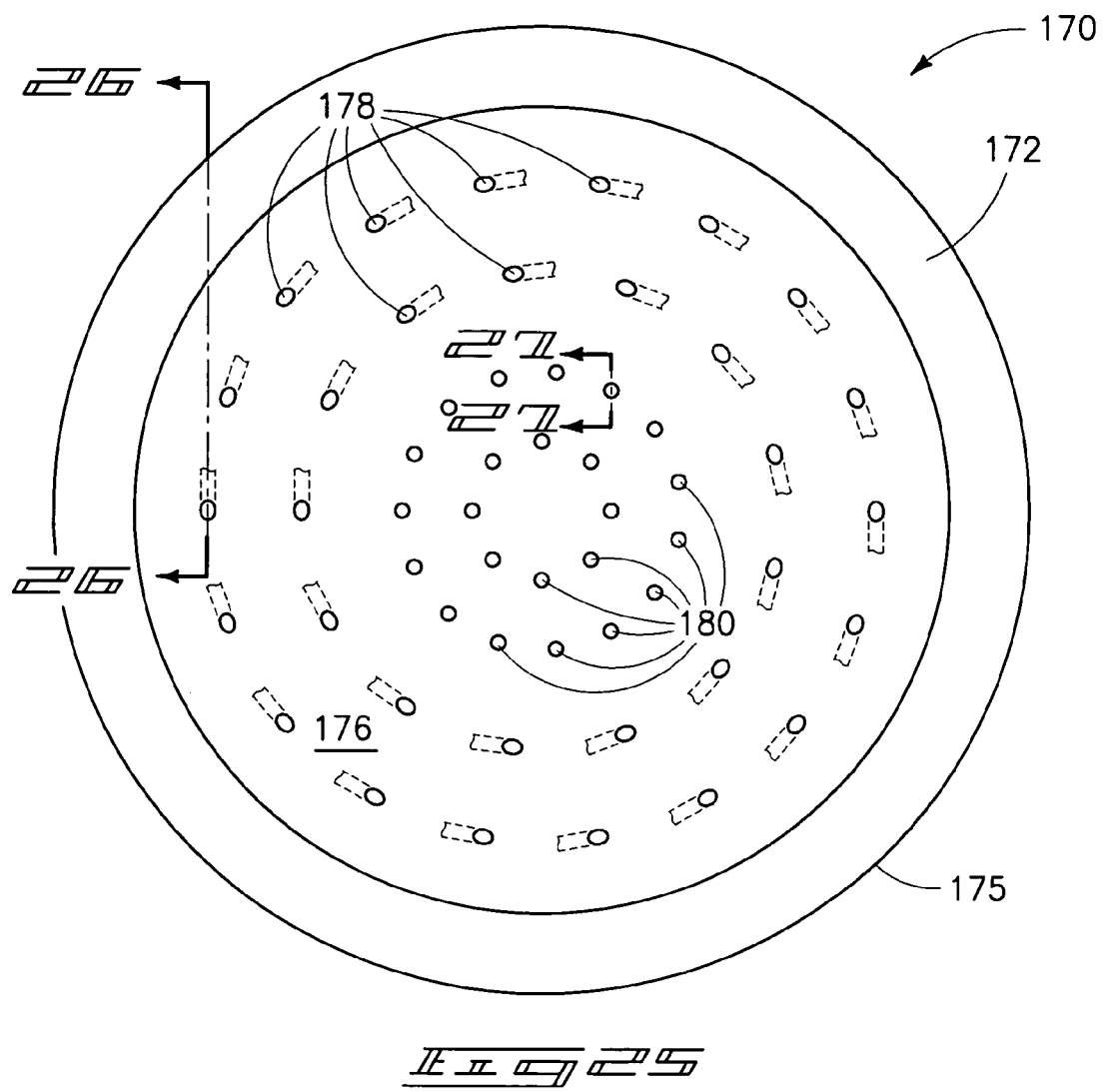
FIG. 25 is a top view of another embodiment susceptor in accordance with an aspect of the invention.
Figures 26, 27:
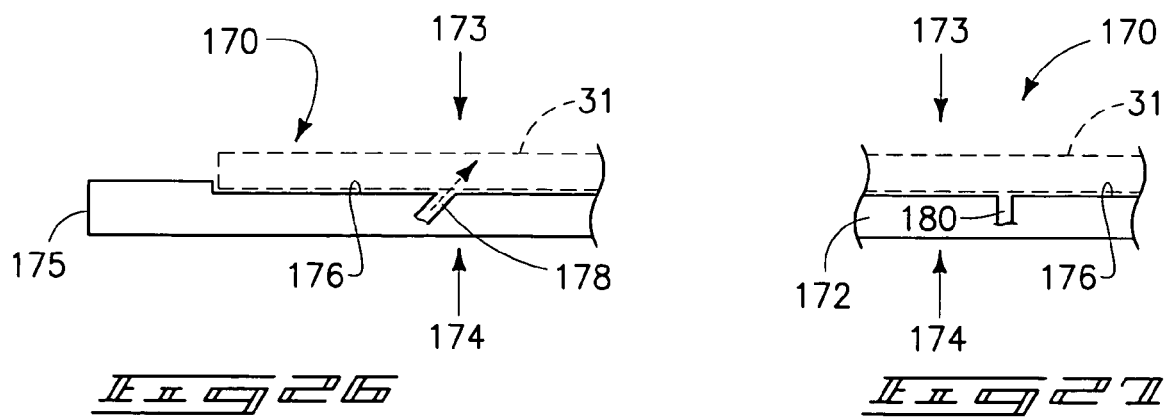
FIG. 26 is a diagrammatic section of the FIG. 25 susceptor taken through line 26-26 in FIG. 25.
FIG. 27 is a diagrammatic section of the FIG. 25 susceptor taken through line 27-27 in FIG. 25.

In one implementation, the invention encompasses a substrate susceptor for receiving a semiconductor substrate to be deposited upon, for example and by way of example only as indicated generally with reference numeral 170 in FIGS. 25-27. Substrate susceptor 170 comprises a body 172 having a front substrate receiving side 173, a back side 174 and a peripheral edge 175. Front substrate receiving side 173 comprises a surface 176 over which at least a portion of a semiconductor substrate 31 to be deposited upon is to be received. Surface 176 comprises at least three gas emitting openings 178/180 configured to apply a substrate levitating and rotating force from gas emitted from such openings effective to levitate and rotate the semiconductor substrate relative to the susceptor body. In the depicted exemplary embodiment, openings 178 with their associated gas conduits are angled other than normal relative to surface 176 and respectively oriented to impart a counterclockwise rotation to a substrate 31 received by the susceptor. Accordingly and depending upon the rate of the volume of gas emitted from openings 178, such may provide both a levitating and rotating force relative to a substrate 31 received over surface 176.

Exemplary openings 180 with their associated gas conduits are shown being received to extend essentially perpendicularly relative to surface 176, thereby providing solely a levitating force of substrate 31 relative to surface 176. Alternately of course, only angled gas openings and conduits, for example openings 178, might be provided and configured to be effective in size and gas emission to both levitate and rotate the semiconductor substrate relative to the susceptor body. Preferably, the gas passageways or conduits would join into a single conduit relative to which the levitating and rotating gas would be injected.

The gas utilized for such levitating and rotating effects preferably is inert relative to the desired deposition occurring on the front side of the substrate. Alternately by way of example only, the emitted gas might comprise one or a mixture of the reactive gases used for deposition upon the substrate. Regardless, the emitted gas is preferably provided at a temperature of from about 200° C. to about 800° C. By way of example only, exemplary emission gases include He, $N_2$, and $H_2$.

In one implementation, the invention encompasses a method of depositing material over a semiconductor substrate which comprises positioning a semiconductor substrate over a surface of a susceptor. Such surface comprises at least three gas-emitting openings therein. Gas is emitted from the at least three openings effective to levitate and rotate the semiconductor substrate relative to the susceptor. While levitating and rotating the semiconductor substrate relative to the susceptor, a material is deposited over the semiconductor substrate. The susceptor itself might remain stationary or also be caused to rotate. Other attributes are, for example, as described in all the above embodiments.

Of course, any two or combination of all of the above embodiments might also be combined in method or structural facets. Further, any of the depositions referred to herein might be by any existing or yet-to-be developed manner, for example by chemical vapor deposition, atomic layer deposition, etc.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A substrate susceptor for physically supporting a semiconductor substrate to be deposited upon, the susceptor comprising a body having a front substrate receiving side face comprising a bearing surface to physically contact and support the semiconductor substrate to be deposited upon, a back side face, and a peripheral edge; the body comprising a ring and a radial inner portion having a recess at least a radial majority of which is non-solid space extending from the front side face to the back side face, the bearing surface being received on said ring, the susceptor comprising extensions extending from said ring into the radially inner portion such that only a portion of the radial inner portion is non-solid space, the extensions comprising a plurality of cross pieces extending across the radial inner portion.

2. The substrate susceptor of claim 1 wherein said cross piece is opaque to infrared radiation.

3. The substrate susceptor of claim 1 wherein said cross piece is transparent to infrared radiation.

4. The substrate susceptor of claim 1 comprising at least two cross pieces extending across the radial inner portion.

5. The substrate susceptor of claim 4 wherein said cross pieces are opaque to infrared radiation.

6. The substrate susceptor of claim 4 wherein said cross pieces are transparent to infrared radiation.

* * * * *